(12) United States Patent
Tang et al.

(10) Patent No.: US 10,157,769 B2
(45) Date of Patent: Dec. 18, 2018

(54) SEMICONDUCTOR DEVICES INCLUDING A DIODE STRUCTURE OVER A CONDUCTIVE STRAP AND METHODS OF FORMING SUCH SEMICONDUCTOR DEVICES

(71) Applicant: Micron Technology, Inc., Boise, ID (US)

(72) Inventors: Sanh D. Tang, Kuna, ID (US); Ming Zhang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/481,301

(22) Filed: Apr. 6, 2017

(65) Prior Publication Data

US 2017/0213761 A1   Jul. 27, 2017

Related U.S. Application Data

(62) Division of application No. 12/715,743, filed on Mar. 2, 2010, now Pat. No. 9,646,869.

(51) Int. Cl.
| | |
|---|---|
| *H01L 21/30* | (2006.01) |
| *H01L 21/46* | (2006.01) |
| *H01L 21/762* | (2006.01) |
| *H01L 27/108* | (2006.01) |
| *H01L 29/66* | (2006.01) |

(Continued)

(52) U.S. Cl.
CPC ............ *H01L 21/762* (2013.01); *H01L 21/32* (2013.01); *H01L 27/0814* (2013.01); *H01L 27/108* (2013.01); *H01L 27/10808* (2013.01); *H01L 27/2454* (2013.01); *H01L 27/2472* (2013.01); *H01L 29/66666* (2013.01); *H01L 29/7827* (2013.01); *H01L 29/861* (2013.01);

(Continued)

(58) Field of Classification Search
CPC ............... H01L 29/861; H01L 29/8613; H01L 29/8615
USPC ........ 438/106, 110, 118, 119, 455, 459, 514, 438/527; 257/506
See application file for complete search history.

(56) References Cited

U.S. PATENT DOCUMENTS

| 3,988,771 A | 10/1976 | Krishna |
|---|---|---|
| 4,487,639 A | 12/1984 | Lam et al. |

(Continued)

FOREIGN PATENT DOCUMENTS

| CN | 101405849 | 4/2009 |
|---|---|---|
| CN | 101621036 | 1/2010 |

(Continued)

OTHER PUBLICATIONS

CN 201180011589.X SR Trans., Aug. 21, 2014, Micron Technology, Inc.

(Continued)

*Primary Examiner* — Lex Malsawma
*Assistant Examiner* — Eric W Jones
(74) *Attorney, Agent, or Firm* — Wells St. John P.S.

(57) ABSTRACT

Semiconductor devices including at least one diode over a conductive strap. The semiconductor device may include at least one conductive strap over an insulator material, at least one diode comprising a single crystalline silicon material over a conductive material, and a memory cell on the at least one diode. The at least one diode may be formed from a single crystalline silicon material. Methods of forming such semiconductor devices are also disclosed.

17 Claims, 8 Drawing Sheets

(51) Int. Cl.
  *H01L 27/24* (2006.01)
  *H01L 21/32* (2006.01)
  *H01L 27/08* (2006.01)
  *H01L 29/861* (2006.01)
  *H01L 29/78* (2006.01)
  *H01L 45/00* (2006.01)

(52) U.S. Cl.
  CPC .......... *H01L 45/06* (2013.01); *H01L 45/1233* (2013.01); *H01L 45/144* (2013.01)

(56) References Cited

U.S. PATENT DOCUMENTS

| | | |
|---|---|---|
| 5,098,861 A | 3/1992 | Blackstone |
| 5,102,821 A | 4/1992 | Moslehi |
| 5,106,776 A | 4/1992 | Shen et al. |
| 5,260,233 A | 11/1993 | Buti et al. |
| 5,373,184 A | 12/1994 | Moslehi |
| 5,378,316 A | 1/1995 | Franke et al. |
| 5,412,598 A | 5/1995 | Shulman |
| 5,465,249 A | 11/1995 | Cooper, Jr. et al. |
| 5,471,039 A | 11/1995 | Irwin, Jr. et al. |
| 5,510,630 A | 4/1996 | Agarwal et al. |
| 5,563,084 A | 10/1996 | Ramm et al. |
| 5,600,160 A | 2/1997 | Hvistendahl |
| 5,874,760 A | 2/1999 | Burns, Jr. et al. |
| 5,904,507 A | 5/1999 | Thomas |
| 5,909,618 A | 6/1999 | Forbes et al. |
| 5,920,105 A | 7/1999 | Okamoto et al. |
| 5,930,640 A | 7/1999 | Kenney |
| 5,936,274 A | 8/1999 | Forbes et al. |
| 5,963,469 A | 10/1999 | Forbes |
| 6,017,778 A | 1/2000 | Pezzani |
| 6,033,957 A | 3/2000 | Burns, Jr. et al. |
| 6,137,128 A | 10/2000 | Holmes et al. |
| 6,191,476 B1 | 2/2001 | Takahashi et al. |
| 6,225,151 B1 | 5/2001 | Gardner et al. |
| 6,225,165 B1 | 5/2001 | Noble, Jr. et al. |
| 6,229,161 B1 | 5/2001 | Nemati et al. |
| 6,245,663 B1 | 6/2001 | Zhao et al. |
| 6,255,731 B1 | 7/2001 | Ohmi et al. |
| 6,274,888 B1 | 8/2001 | Suzuki et al. |
| 6,294,418 B1 | 9/2001 | Noble |
| 6,303,468 B1 | 10/2001 | Aspar et al. |
| 6,335,231 B1 | 1/2002 | Yamazaki et al. |
| 6,335,258 B1 | 1/2002 | Aspar et al. |
| 6,352,894 B1 | 3/2002 | Goebel et al. |
| 6,355,501 B1 | 3/2002 | Fung et al. |
| 6,355,520 B1 | 3/2002 | Park et al. |
| 6,365,488 B1 | 4/2002 | Liao |
| 6,391,658 B1 | 5/2002 | Gates et al. |
| 6,492,662 B2 | 12/2002 | Hsu et al. |
| 6,525,953 B1 | 2/2003 | Johnson |
| 6,559,471 B2 | 5/2003 | Finder et al. |
| 6,576,944 B2 | 6/2003 | Weis |
| 6,593,624 B2 | 7/2003 | Walker |
| 6,600,173 B2 | 7/2003 | Tiwari |
| 6,627,924 B2 | 9/2003 | Hsu et al. |
| 6,649,980 B2 | 11/2003 | Noguchi |
| 6,653,174 B1 | 11/2003 | Cho et al. |
| 6,690,038 B1 | 2/2004 | Cho et al. |
| 6,690,039 B1 | 2/2004 | Nemati et al. |
| 6,713,791 B2 | 3/2004 | Hsu et al. |
| 6,713,810 B1 | 3/2004 | Bhattacharyya |
| 6,727,529 B2 | 4/2004 | Nemati et al. |
| 6,744,094 B2 | 6/2004 | Forbes |
| 6,756,286 B1 | 6/2004 | Moriceau et al. |
| 6,764,774 B2 | 7/2004 | Grill et al. |
| 6,768,156 B1 | 7/2004 | Bhattacharyya |
| 6,777,745 B2 | 8/2004 | Hshieh et al. |
| 6,809,044 B1 | 10/2004 | Aspar et al. |
| 6,812,504 B2 | 11/2004 | Bhattacharyya |
| 6,815,781 B2 | 11/2004 | Vyvoda et al. |
| 6,841,813 B2 | 1/2005 | Walker et al. |
| 6,845,034 B2 | 1/2005 | Bhattacharyya |
| 6,870,202 B2 | 3/2005 | Oka |
| 6,881,994 B2 | 4/2005 | Lee et al. |
| 6,882,008 B1 | 4/2005 | Ohsawa |
| 6,888,199 B2 | 5/2005 | Nowak et al. |
| 6,891,205 B1 | 5/2005 | Cho et al. |
| 6,906,354 B2 | 6/2005 | Hsu et al. |
| 6,914,286 B2 | 7/2005 | Park |
| 6,934,209 B2 | 8/2005 | Marr |
| 6,940,748 B2 | 9/2005 | Nejad et al. |
| 6,940,761 B2 | 9/2005 | Forbes |
| 6,946,365 B2 | 9/2005 | Aspar et al. |
| 6,953,953 B1 | 10/2005 | Horch |
| 6,958,263 B2 | 10/2005 | Bhattacharyya |
| 6,958,513 B2 | 10/2005 | Wang |
| 6,965,129 B1 | 11/2005 | Horch et al. |
| 6,992,349 B2 | 1/2006 | Lee et al. |
| 6,995,456 B2 | 2/2006 | Nowak |
| 7,015,092 B2 | 3/2006 | Jaiprakash et al. |
| 7,029,950 B2 | 4/2006 | Hsu et al. |
| 7,052,941 B2 | 5/2006 | Lee |
| 7,075,146 B2 | 7/2006 | Forbes |
| 7,081,663 B2 | 7/2006 | Bulucea |
| 7,115,939 B2 | 10/2006 | Forbes |
| 7,120,046 B1 | 10/2006 | Forbes |
| 7,129,538 B2 | 10/2006 | Lee et al. |
| 7,151,024 B1 | 12/2006 | Forbes |
| 7,157,771 B2 | 1/2007 | Forbes |
| 7,158,401 B2 | 1/2007 | Bhattacharyya |
| RE39,484 E | 2/2007 | Bruel |
| 7,180,135 B1 | 2/2007 | Ioannou |
| 7,195,959 B1 | 3/2007 | Plummer et al. |
| 7,205,185 B2 | 4/2007 | Dokumaci et al. |
| 7,250,628 B2 | 7/2007 | Bhattacharyya |
| 7,250,646 B2 | 7/2007 | Walker et al. |
| 7,259,415 B1 | 8/2007 | Forbes |
| 7,268,373 B1 | 9/2007 | Gupta et al. |
| 7,271,052 B1 | 9/2007 | Forbes |
| 7,279,740 B2 | 10/2007 | Bhattacharyya et al. |
| 7,304,327 B1 | 12/2007 | Nemati et al. |
| 7,323,380 B2 | 1/2008 | Forbes |
| 7,326,969 B1 | 2/2008 | Horch |
| 7,338,862 B2 | 3/2008 | Huo et al. |
| 7,358,120 B2 | 4/2008 | Furukawa et al. |
| 7,359,229 B2 | 4/2008 | Ferrant et al. |
| 7,362,609 B2 | 4/2008 | Harrison et al. |
| 7,368,352 B2 | 5/2008 | Kim et al. |
| 7,378,325 B2 | 5/2008 | Kaneko et al. |
| 7,410,867 B2 | 8/2008 | Forbes |
| 7,415,690 B2 | 8/2008 | Liang et al. |
| 7,440,310 B2 | 10/2008 | Bhattacharyya |
| 7,456,439 B1 | 11/2008 | Horch |
| 7,476,939 B2 | 1/2009 | Okhonin et al. |
| 7,488,627 B1 | 2/2009 | Nemati et al. |
| 7,491,608 B2 | 2/2009 | Forbes |
| 7,518,182 B2 | 4/2009 | Abbott et al. |
| 7,525,137 B2 | 4/2009 | Walker et al. |
| 7,538,000 B2 | 5/2009 | Dao |
| 7,560,336 B2 | 7/2009 | Abbott |
| 7,579,240 B2 | 8/2009 | Forbes |
| 7,589,995 B2 | 9/2009 | Tang et al. |
| 7,592,209 B2 | 9/2009 | Chang |
| 7,615,436 B2 | 11/2009 | Kouznetsov et al. |
| 7,619,917 B2 | 11/2009 | Nirschl et al. |
| 7,629,651 B2 | 12/2009 | Nakajima |
| 7,663,188 B2 | 2/2010 | Chung |
| 7,736,969 B2 | 6/2010 | Abbott et al. |
| 7,786,505 B1 | 8/2010 | Yang et al. |
| 7,816,728 B2 | 10/2010 | Ho et al. |
| 7,825,455 B2 | 11/2010 | Lee et al. |
| 7,838,360 B2 | 11/2010 | Forbes |
| 7,851,859 B2 | 12/2010 | Kyun et al. |
| 7,883,962 B2 | 2/2011 | Noble |
| 7,897,440 B1 | 3/2011 | Horch |
| 7,929,343 B2 | 4/2011 | Tang et al. |
| 8,018,058 B2 | 9/2011 | Lee |
| 8,084,316 B2 | 12/2011 | Huo et al. |
| 8,102,025 B2 | 1/2012 | Ozeki et al. |
| 8,148,780 B2 | 4/2012 | Tang et al. |

(56) References Cited

U.S. PATENT DOCUMENTS

| | | | |
|---|---|---|---|
| 8,476,145 B2 * | 7/2013 | Or-Bach | H01L 21/6835 438/197 |
| 8,501,559 B2 | 8/2013 | Tang et al. | |
| 8,501,581 B2 | 8/2013 | Tang et al. | |
| 8,507,966 B2 | 8/2013 | Tang et al. | |
| 8,518,812 B2 | 8/2013 | Mariani et al. | |
| 8,519,431 B2 | 8/2013 | Nemati et al. | |
| 8,524,543 B2 | 9/2013 | Tang | |
| 8,558,220 B2 | 10/2013 | Schricker et al. | |
| 8,598,621 B2 | 12/2013 | Tang | |
| 8,772,848 B2 | 7/2014 | Zahurak | |
| 9,209,187 B1 | 12/2015 | Mariani et al. | |
| 9,214,389 B2 | 12/2015 | Righetti et al. | |
| 9,224,738 B1 | 12/2015 | Zanderigo et al. | |
| 2001/0002062 A1 | 5/2001 | Noble, Jr. et al. | |
| 2001/0024841 A1 | 9/2001 | Noble, Jr. et al. | |
| 2001/0026477 A1 | 10/2001 | Manning | |
| 2001/0048119 A1 | 12/2001 | Mizuno et al. | |
| 2002/0024152 A1 | 2/2002 | Momoi et al. | |
| 2002/0028541 A1 | 3/2002 | Lee et al. | |
| 2002/0070454 A1 | 6/2002 | Yasukawa | |
| 2002/0079537 A1 | 6/2002 | Houston | |
| 2002/0081753 A1 | 6/2002 | Gates et al. | |
| 2002/0094619 A1 | 7/2002 | Mandelman et al. | |
| 2002/0142562 A1 | 10/2002 | Chan et al. | |
| 2002/0158254 A1 | 10/2002 | Hsu et al. | |
| 2002/0163019 A1 | 11/2002 | Mohsen | |
| 2002/0185684 A1 | 12/2002 | Campbell et al. | |
| 2002/0190265 A1 | 12/2002 | Hsu et al. | |
| 2002/0190298 A1 | 12/2002 | Alsmeier et al. | |
| 2003/0006461 A1 | 1/2003 | Tezuka et al. | |
| 2003/0102469 A1 | 6/2003 | Jones et al. | |
| 2003/0164501 A1 | 9/2003 | Suzuki et al. | |
| 2003/0186521 A1 * | 10/2003 | Kub | H01L 21/76254 438/558 |
| 2003/0211705 A1 | 11/2003 | Tong et al. | |
| 2003/0223292 A1 | 12/2003 | Nejad et al. | |
| 2003/0235710 A1 | 12/2003 | Grill et al. | |
| 2004/0007717 A1 | 1/2004 | Yoo | |
| 2004/0022105 A1 | 2/2004 | Ohsawa | |
| 2004/0094758 A1 | 5/2004 | Usuda et al. | |
| 2004/0097022 A1 | 5/2004 | Werkhoven | |
| 2004/0130015 A1 | 7/2004 | Ogihara et al. | |
| 2004/0159853 A1 | 8/2004 | Nemati et al. | |
| 2004/0174734 A1 | 9/2004 | Forbes | |
| 2004/0214379 A1 | 10/2004 | Lee et al. | |
| 2004/0233761 A1 | 11/2004 | Schwabe et al. | |
| 2004/0252679 A1 | 12/2004 | Ohsawa | |
| 2004/0262635 A1 | 12/2004 | Lee | |
| 2005/0001232 A1 | 1/2005 | Bhattacharyya | |
| 2005/0037582 A1 | 2/2005 | Dennard et al. | |
| 2005/0059252 A1 | 3/2005 | Dokumaci et al. | |
| 2005/0062079 A1 | 3/2005 | Wu | |
| 2005/0146955 A1 | 7/2005 | Kajiyama | |
| 2005/0230356 A1 | 10/2005 | Empedocles et al. | |
| 2005/0282318 A1 | 12/2005 | Dao | |
| 2005/0282356 A1 | 12/2005 | Lee | |
| 2006/0010056 A1 | 1/2006 | De La Motte | |
| 2006/0034116 A1 | 2/2006 | Lam et al. | |
| 2006/0071074 A1 | 4/2006 | Konevecki et al. | |
| 2006/0082004 A1 | 4/2006 | Parekh et al. | |
| 2006/0099776 A1 | 5/2006 | Dupont | |
| 2006/0124974 A1 | 6/2006 | Cabral et al. | |
| 2006/0125011 A1 | 6/2006 | Chang | |
| 2006/0197115 A1 | 9/2006 | Toda | |
| 2006/0227601 A1 | 10/2006 | Bhattacharyya | |
| 2006/0249770 A1 | 11/2006 | Huo et al. | |
| 2007/0012945 A1 | 1/2007 | Sugizaki | |
| 2007/0018166 A1 | 1/2007 | Atanackovic et al. | |
| 2007/0018223 A1 | 1/2007 | Abbott | |
| 2007/0023805 A1 | 2/2007 | Wells et al. | |
| 2007/0023817 A1 | 2/2007 | Dao | |
| 2007/0029607 A1 | 2/2007 | Kouznetsov | |
| 2007/0045709 A1 | 3/2007 | Yang | |
| 2007/0047364 A1 | 3/2007 | Chuang et al. | |
| 2007/0051994 A1 | 3/2007 | Song et al. | |
| 2007/0057328 A1 | 3/2007 | Taniguchi et al. | |
| 2007/0064342 A1 | 3/2007 | Nakamura | |
| 2007/0077694 A1 | 4/2007 | Lee | |
| 2007/0080385 A1 | 4/2007 | Kim et al. | |
| 2007/0121696 A1 | 5/2007 | Ishii | |
| 2007/0127289 A1 | 6/2007 | Lee | |
| 2007/0178649 A1 | 8/2007 | Swift et al. | |
| 2007/0215954 A1 | 9/2007 | Mouli | |
| 2007/0252175 A1 | 11/2007 | Tang et al. | |
| 2007/0264771 A1 | 11/2007 | Anathan et al. | |
| 2008/0003774 A1 | 1/2008 | Baek | |
| 2008/0003778 A1 | 1/2008 | Eyck et al. | |
| 2008/0041517 A1 * | 2/2008 | Moriceau | H01L 24/83 156/182 |
| 2008/0124867 A1 | 5/2008 | Brown | |
| 2008/0128802 A1 | 6/2008 | Huo et al. | |
| 2008/0149984 A1 | 6/2008 | Chang et al. | |
| 2008/0164528 A1 | 7/2008 | Cohen et al. | |
| 2008/0211023 A1 | 9/2008 | Shino | |
| 2008/0211061 A1 | 9/2008 | Atwater, Jr. et al. | |
| 2008/0233694 A1 | 9/2008 | Li | |
| 2008/0237776 A1 | 10/2008 | Abbott | |
| 2008/0246023 A1 | 10/2008 | Zeng et al. | |
| 2008/0296712 A1 | 12/2008 | Feuillet | |
| 2008/0299753 A1 | 12/2008 | Figura et al. | |
| 2009/0003025 A1 | 1/2009 | Makhleshi et al. | |
| 2009/0010056 A1 | 1/2009 | Kuo et al. | |
| 2009/0014813 A1 | 1/2009 | Chao et al. | |
| 2009/0022003 A1 | 1/2009 | Song et al. | |
| 2009/0026522 A1 | 1/2009 | Anathan | |
| 2009/0050948 A1 | 2/2009 | Ishikawa | |
| 2009/0072341 A1 | 3/2009 | Liu et al. | |
| 2009/0079030 A1 | 3/2009 | Cheng et al. | |
| 2009/0108351 A1 | 4/2009 | Yang et al. | |
| 2009/0129145 A1 | 5/2009 | Slesazeck | |
| 2009/0140290 A1 | 6/2009 | Schulze et al. | |
| 2009/0170261 A1 | 7/2009 | Lee | |
| 2009/0173964 A1 | 7/2009 | Ward | |
| 2009/0179262 A1 | 7/2009 | Holz | |
| 2009/0189228 A1 | 7/2009 | Zhang et al. | |
| 2009/0200536 A1 | 8/2009 | Van Schaijk et al. | |
| 2009/0201723 A1 | 8/2009 | Okhonin et al. | |
| 2009/0207681 A1 | 8/2009 | Juengling | |
| 2009/0213648 A1 | 8/2009 | Siesazeck | |
| 2009/0218656 A1 | 9/2009 | Gonzalez et al. | |
| 2009/0242865 A1 | 10/2009 | Lung et al. | |
| 2009/0246952 A1 | 10/2009 | Ishizaka et al. | |
| 2009/0250738 A1 | 10/2009 | Dyer | |
| 2009/0315084 A1 | 12/2009 | Cha et al. | |
| 2010/0001271 A1 | 1/2010 | Fumitake | |
| 2010/0006938 A1 | 1/2010 | Jang | |
| 2010/0008139 A1 | 1/2010 | Bae | |
| 2010/0044670 A1 | 2/2010 | Ling | |
| 2010/0061145 A1 | 3/2010 | Weis | |
| 2010/0197141 A1 | 8/2010 | Tu et al. | |
| 2010/0200916 A1 | 8/2010 | Gossner et al. | |
| 2010/0203695 A1 | 8/2010 | Oh et al. | |
| 2010/0207180 A1 | 8/2010 | Lee | |
| 2010/0248153 A1 | 9/2010 | Lee et al. | |
| 2010/0277982 A1 | 11/2010 | Okhonin | |
| 2011/0006377 A1 | 1/2011 | Lee et al. | |
| 2011/0024791 A1 | 2/2011 | Schulze et al. | |
| 2011/0156044 A1 | 6/2011 | Lee et al. | |
| 2011/0163357 A1 | 7/2011 | Tan et al. | |
| 2011/0215371 A1 | 9/2011 | Tang et al. | |
| 2011/0215396 A1 | 9/2011 | Tang et al. | |
| 2011/0215407 A1 | 9/2011 | Tang et al. | |
| 2011/0215408 A1 | 9/2011 | Tang et al. | |
| 2011/0215436 A1 | 9/2011 | Tang et al. | |
| 2011/0223725 A1 | 9/2011 | Kang et al. | |
| 2011/0223731 A1 | 9/2011 | Chung et al. | |
| 2011/0309434 A1 | 12/2011 | Huang et al. | |
| 2012/0205736 A1 | 8/2012 | Housley | |
| 2012/0223369 A1 | 9/2012 | Gupta et al. | |
| 2012/0223380 A1 | 9/2012 | Lee et al. | |
| 2014/0008721 A1 | 1/2014 | Filippini et al. | |

(56) References Cited

U.S. PATENT DOCUMENTS

| | | |
|---|---|---|
| 2014/0106554 A1 | 4/2014 | Pozzi et al. |
| 2016/0049404 A1 | 2/2016 | Mariani et al. |

FOREIGN PATENT DOCUMENTS

| | | |
|---|---|---|
| EP | 1918998 | 5/2008 |
| JP | H02-275663 | 11/1990 |
| JP | H04-64249 | 2/1992 |
| JP | H04-186815 | 7/1992 |
| JP | H04-283914 | 10/1992 |
| JP | 06-104446 | 4/1994 |
| JP | H08-088153 | 4/1996 |
| JP | H10-150176 | 6/1998 |
| JP | H11-103035 | 4/1999 |
| JP | 2000-150905 | 5/2000 |
| JP | 2003-030980 | 1/2003 |
| JP | 2004-303398 | 10/2004 |
| JP | 2005-136191 | 5/2005 |
| JP | 2005-327766 | 11/2005 |
| JP | 2007-511895 | 5/2007 |
| JP | 2008-010503 | 1/2008 |
| JP | 2009-531860 | 9/2009 |
| JP | 2011-508979 | 3/2011 |
| KR | 2009-0040460 | 4/2006 |
| KR | 10-0663359 | 10/2006 |
| KR | 10-0702014 | 11/2006 |
| KR | 10-0821456 | 4/2008 |
| KR | 2009-0054245 | 5/2009 |
| KR | 10-2010-0070835 | 6/2010 |
| TW | 200802866 | 1/2008 |
| WO | WO 2007/123609 | 11/2007 |
| WO | WO 2009/088889 | 7/2009 |

OTHER PUBLICATIONS

CN 201180011589.X SR Trans., Apr. 10, 2015, Micron Technology, Inc.
CN 201180011628.6 SR Trans., Jun. 25, 2014, Micron Technology, Inc.
CN 201180011628.6 SR Trans., Feb. 27, 2015, Micron Technology, Inc.
CN 201180011630.3 SR Trans., Jul. 7, 2014, Micron Technology, Inc.
CN 11751050 Supp. Search Rept., dated Nov. 14, 2014, Micron Technology, Inc.
CN 11751053 Supp. Search Rept., dated Jun. 4, 2014, Micron Technology, Inc.
WO PCT/US2011/024354 IPRP, Sep. 4, 2012, Micron Technology, Inc.
WO PCT/US2011/024354 SR/WO, Sep. 20, 2011, Micron Technology, Inc.
WO PCT/US2011/024376 IPRP, Sep. 4, 2012, Micron Technology, Inc.
WO PCT/US2011/024376 SR/WO, Sep. 28, 2011, Micron Technology, Inc.
WO PCT/US2011/024387 IPRP, Sep. 4, 2012, Micron Technology, Inc.
WO PCT/US2011/024387 SR/WO, Sep. 21, 2011, Micron Technology, Inc.
WO PCT/US2012/021438 IPRP, Aug. 13, 2013, Micron Technology, Inc.
WO PCT/US2012/021438 Search Rept., dated Aug. 28, 2012, Micron Technology, Inc.
WO PCT/US2012/021438 Writ. Opin., dated Aug. 28, 2012, Micron Technology, Inc.
WO PCT/US2012/025109 IPRP, Sep. 10, 2013, Micron Technology, Inc.
WO PCT/US2012/025109 Search Rept., dated Sep. 20, 2012, Micron Technology, Inc.
WO PCT/US2012/025109 Writ. Opin., dated Sep. 20, 2012, Micron Technology, Inc.
WO PCT/US2012/025115 IPRP, Sep. 12, 2013, Micron Technology, Inc.
WO PCT/US2012/025115 Search Rept., dated Oct. 4, 2012, Micron Technology, Inc.
WO PCT/US2012/025115 Writ. Opin., dated Oct. 4, 2012, Micron Technology, Inc.
TW 100106775 SR Trans., Jun. 19, 2014, Micron Technology, Inc.
TW 100106776 SR Trans., Nov. 25, 2014, Micron Technology, Inc.
TW 100106777 SR Trans., Feb. 13, 2014, Micron Technology, Inc.
TW 101104088 SR Trans., Dec. 17, 2013, Micron Technology, Inc.
TW 101106601 SR Trans., Apr. 3, 2014, Micron Technology, Inc.
TW 101107759 SR Trans., Jun. 10, 2014, Micron Technology, Inc.
"IBM Builds World's Fastest Communications Microchip", Reuters U.S. Company News, Feb. 25, 2002, http://activequote300.fidelity.com/rtrnews/----individual----n . . . / . . . , 1 pg.
Bae, G.J. et al., "A Novel SiGe-Inserted SOI Structure for High Performance PDSOI CMOSFET", IEDM Tech. Digest, 2000, pp. 667-670.
Belford, et al., Performance-Augmented CMOS Using Back-End Uniaxial Strain, DRC Conf. Digest, 2002, pp. 41-42.
Bhattacharyya, A., "The Role of Microelectronic Integration in Environmental Control: A Perspective", Mat. Res. Soc. Symp. Proc. vol. 344, 1994, pp. 281-293.
Burke et al., "Silicon Carbide Thyristors for Power Applications", Pulsed Power Conference 1995, Digest of Technical Papers, 10th IEEE International vol. 1, United States, pp. 327-335.
Cheng, Z. et al., "SiGe-on-Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., Oct. 2001, pp. 13-14, 3-pg. outline.
Cheong et al., "Investigation of Ultralow Leakage in MOS Capacitors on4H SiC", IEEE Transactions on Electron Devices, vol. 51(9), Sep. 2004, United States, pp. 1361-1365.
Cho et al., "A Novel Capacitor-Less DRAM Cell Using Thin Capacitively-Coupled Thyristor (TCCT)", IEEE, 2005, U.S., 4 pages.
Current, M.I. et al., "Atomic-Layer Cleaving with SixGey Strain Layers for Fabrication of Si and Ge-Rich SOI Device Layers", 2001 IEEE Internatl. SOI Conf. Oct. 2001, pp. 11-12.
Dimitriadis et al., "New a-SiC, Opticaliy Controlled, Thyristor-Like Switch", Electronics Letters, vol. 28(17), Aug. 13, 1992, United Kingdom, pp. 1622-1624.
Ernst, T. et al., "Fabrication of a Novel Strained SiGe:C-channel Planar 55 nm nMOSFET for High-Performance CMOS", 2002 Sympos. on VLSI Tech. Digest of Technical Papers, pp. 92-93.
Feder, B.J. "I.B.M. Finds Way to Speed Up Chips", The New York Times, Jun. 8, 2001, reprinted from http://www.nytimes.com/2001/06/08 /technology/08BLUE.html, 2 pgs.
Garone, P.M. et al., "Mobility Enhancement and Quantum Mechanical Modeling in GexSi1-x Channel MOSFETs from 90 to 300K", IEDM Tech. Digest, 1991, pp. 29-32.
Gu, J. et al., "High Performance Sub-100 nm Si Thin-Film Transistors by Pattern-Controlled Crystallization of Thin Channel Layer and High Temperature Annealing", DRC Conf. Digest 2002, pp. 49-50.
Hara, A. et al., "Selective Single-Crystalline-Silicon Growth at the Pre-Defined Active Regions of TFTs on a Glass by a Scanning CW Layer Irradiation", IEDM Tech. Digest, 2000, pp. 209-212.
Hara, A. et al., "High Performance Poly-Si TFTS on a Glass by a Stable Scanning CW Laser Lateral Crystallization", IEDM Tech. Digest, 2001, pp. 747-750.
Huang, L.J. et al., "Carrier Mobility Enhancement in Strained Si-on-Insulator Fabricated by Wafer Bonding", 2001 Sympos. on VLSI Tech. Digest of Technical Papers, pp. 57-58.
Jaguar, S. et al., "Single Grain Thin-Fim-Transistor (TFT) with SOI CMOS Performance Formed by Metal-Induced-Lateral-Crystallization", IEDM Tech. Digest, 1999, p. 293-6.

(56) References Cited

OTHER PUBLICATIONS

Jen et al., "Electrical and Luminescent Characteristics of a-SiC:H P-I-N Thin-Film LED's with Graded-Gap Junctions", IEEEE Transactions on Electron Devices, vol. 44(4), Apr. 1997, United States, pp. 565-571.

Jeon, J. el al., "A New Poly-Si TFT with Selectively Doped Channel Fabricated by Novel Excimer Laser Annealing", IEDM Tech. Digest, 2000, pp. 213-216.

Kesan, V. et al., "High Performance 0.25 µm p-MOSFETs with Silicon-Germanium Channels for 300K and 77K Operation", IEDM Tech. Digest, 1991, pp. 25-28.

Kim, C.H. et al., "A New High-Performance Poly-Si TFT by Simple Excimer Laser Annealing on Selectively Floating a-Si Layer", IEDM Tech. Digest, 2001, pp. 751-754.

King, T. et al, "A Low-Temperature (?550° C.) Silicon-Germanium MOS Thin-Film Transistor Technology for Large-Area Electronics", IEDM Tech. Digest, 1991, pp. 567-570.

Kuriyama, H. et al., "High Mobility Poly-Si TFT by a New Excimer Laser Annealing Method for Large Area Electronics", IEDM Tech. Digest, 1991, pp. 563-566.

Li, P. et al., "Design of High Speed Si/SiGe Heterojunction Complementary MOSFETs with Reduced Short-Channel Effects", Natl. Central University, ChungLi, Taiwan, ROC, Aug. 2001, Contract No. NSC 89-2215-E-008-049, Natl. Science Council of Taiwan., pp. 1, 9.

Lu, N.C.C. et al., "A Buried-Trench DRAM Cell Using a Self-Aligned Epitaxy Over Trench Technology", IEDM Tech. Digest, 1988, pp. 588-591.

Markoff, J., "I.B.M. Circuits are Now Faster and Reduce Use of Power", The New York Times, Feb. 25, 2002, reprinted Mar. 20, 2002, from http://story.news.yahoo.com/ news?tmpl=story&u=/nyt/20020225/ . . . , 1 pg.

Mizuno, T. et al., "High Performance CMOS Operation of Strained-SOI MOSFETs Using Thin Film SiGe-on-Insulator Substrate", 2002 Sympos. on VLSI Tech. Digest of Technical Papers, p. 106-107.

Myers, S.M. et al., "Deuterium Interactions in Oxygen-Implanted Copper", J. Appl. Phys., vol. 65(1),. Jan. 1, 1989; p. 311-321.

Nayfeh, H.M. et al., "Electron Inversion Layer Mobility in Strained-Si n-MOSFET's with High Channel Doping Concentration Achieved by Ion Implantation", DRC Conf. Digest, 2002, pp. 43-44.

Nemati et al., "A Novel High Density, Low Voltage SRAM Cell with a Vertical NDR Device", IEEE, 1998, United States, 2 pages.

Ono, K. et al., "Analysis of Current-Voltage Characteristics in Polysilicon TFTs for LCDs", IEDM Tech. Digest, 1988, pp. 256-259.

Park, et al., "Normal incident SiGe/Si Multiple Quantum Well Infrared Detector", IEDM Tech. Digest, 1991, pp. 749-752.

Powell et al., "SiC Materials—Progress, Status, and Potential Roadblocks", Proceedings of the IEEE, vol. 90(6), Jun. 2002, United States, pp. 942-955.

Rim, K. et al., "Characteristics and Device Design of Sub-100 nm Strained SiN- and PMOSFETs", 2002 Sympos. on VLSI Tech. Digest of Technical Papers, pp. 98-99.

Rim, K. et al., "Strained Si NMOSFET's for High Performance CMOS Technology", 2001 Sympos. on VLSI Tech. Digest of Technical Papers, pp. 59-60.

Saggio, M. et al., "Innovative Localized Lifetime Control in High-Speed IGBT's", IEEE Elec. Dev. Lett., V. 18, No. 7, Jul. 1997, pp. 333-335.

Sasago et al., "Cross-point phase change memory with 4F2 cell size driven by low-contact-resistivity poly-Si diode", 2009 Symposium on VLSI Technology Digest of Technical Papers, pp. 24-25.

Shima, M. et al., "<100> Channel Strained-SiGe p-MOSFETs with Enhanced Hole Mobility and Lower Parasitic Resistance", 2002 Sympos. on—VLSI Tech. Digest of Technical Papers, pp. 94-95.

Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", 2008 Symposium on VLSI Technology Digest of Technical Papers.

Suliman et al., "Gate-Oxide Grown on the Sidewalls and Base of aU-Shaped Si Trench: Effects of the Oxide and Oxide/Si Interface Condition on the Properties of Vertical MOS Devices", Microelectronic Engineering vol. 72, 2004, Netherlands, pp. 247-252.

Takagi, Strained-Si- and SiGe-on-Insulator (Strained SOI and SGOI) MOSFETs for High Performance/Low Power CMOS Application, DRC Conf. Digest. 2002, pp. 37-40.

Tezuka, T. et al., "High-Performance Strained Si-on-Insulator MOSFETs by Novel Fabrication Processes Utilizing Ge-Condensation Technique", 2002 VLSI Tech. Digest of Technical Papers, pp. 96-97.

Tzeng et al., "Dry Etching of Silicon Materials in SF6 Based Plasmas", J. Electrochem. Soc., 1987 vol. 134, issue 9, pp. 2304-2303

Van Meer, H. et al., "Ultra-Thin Film Fully-Depleted SOI CMOS with Raised G/S/D Device Architecture for Sub-100 nm Applications", 2001 IEEE Internatl. SOI Conf. Oct. 2001, pp. 45-46.

Xie et al., "A Vertically Integrated Bipolar Storage Cell in 6H Silicon Carbide fer Nonvolatile Memory Applications", IEEE Electron Device Letters, vol. 15(6), Jun. 1994; United States, pp. 212-214.

Yamada, T. et al., "Spread Source/Drain (SSD) MOSFET Using Selective Silicon Growth for 64Mbit DRAMs", IEDM Tech. Digest, 1989, pp. 35-38.

Yamauchi, N. et al., "Drastically Improved Performance in Poly-Si TFTs with Channel Dimensions Comparable to Grain Size", IEDM Tech. Digest, 1989, pp. 353-356.

Yang et al., "High Performance CMOS Fabricated on Hybrid Substrate with Different Crystal Orientations", IEEE Electron Devices Meeting, 2003, United States, pp. 453-456.

Yu et al., "Low-Temperature Titanium-Based Wafer Bonding", Journal of the Electrochemical Society vol. 154, No. 1, 2007, United States, pp. H20-H25.

\* cited by examiner

SEMICONDUCTOR DEVICES INCLUDING A DIODE STRUCTURE OVER A CONDUCTIVE STRAP AND METHODS OF FORMING SUCH SEMICONDUCTOR DEVICES

CROSS-REFERENCE TO RELATED APPLICATIONS

This patent resulted from a divisional of U.S. patent application Ser. No. 12/715,743 which was filed Mar. 2, 2010; which is related to co-pending U.S. patent application Ser. No. 12/715,704 filed on Mar. 2, 2010, and titled "SEMICONDUCTOR-METAL-ON-INSULATOR STRUCTURES, METHODS OF FORMING SUCH STRUCTURES, AND SEMICONDUCTOR DEVICES INCLUDING SUCH STRUCTURES"; co-pending U.S. patent application Ser. No. 12/715,843 filed on; Mar. 2, 2010, and titled "FLOATING BODY CELL STRUCTURES, DEVICES INCLUDING SAME AND METHODS FOR FORMING SAME; co-pending U.S. patent application Ser. No. 12/715,889 filed on Mar. 2, 2010, and titled "THYRISTOR BASED MEMORY CELLS, DEVICES AND SYSTEMS INCLUDING THE SAME AND METHODS FOR FORMING THE SAME", and co-pending U.S. patent application Ser. No. 12/715,922 filed on Mar. 2, 2010, and titled "SEMICONDUCTOR CELLS, ARRAYS, DEVICES AND SYSTEMS HAVING A BURIED CONDUCTIVE LINE AND METHODS FOR FORMING SAME", the disclosures of which are incorporated herein by reference.

TECHNICAL FIELD

The present invention, in various embodiments, relates generally to semiconductor structures including a diode and methods of forming such semiconductor structures. More specifically, embodiments of the present invention relate to a diode structure having a conductive strap, devices including such a diode structure, and methods of forming such a diode structure.

BACKGROUND

One of the common trends in the electronics industry is the miniaturization of electronic devices. This is especially true for electronic devices operated through the use of semiconductor microchips. Microchips are commonly viewed as the so-called "brains" of most electronic devices. In general, a microchip comprises a small silicon wafer upon which are built thousands of microscopic electronic devices that are integrally configured to form electronic circuits. The circuits are interconnected in a unique way to perform a desired function.

With the desire to decrease the size of electronic devices, it is also necessary to decrease the size of the microchip and electronic devices thereon. This movement has increased the number and complexity of circuits on a single microchip.

Conventionally, electronic devices are formed side-by-side in a single plane on a common substrate, such as a silicon wafer. This side-by-side positioning, however, uses a relatively large amount of surface area or so-called "real estate" on the substrate. As a result, larger substrates are required.

A recent trend is to vertically stack semiconductor devices on a single substrate. However, the stacking of semiconductor devices adds an additional degree of complexity to arranging the components of the semiconductor device. Furthermore, the processing conditions for fabrication of stacked or superimposed devices must be controlled so as not to damage components in underlying devices. In addition to stacking semiconductor devices, individual devices may be formed having high aspect ratios (i.e., the ratio of height to width). However, these high aspect ratios can increase the risk of the breakage of the device because of the limited surface area of the bond between the device to the substrate. Similarly, as the size of the devices decrease, interconnects, such as bit lines and word lines, may also need to decrease in size, e.g., width. In some cases, the size of the device may be so small that it becomes impractical, if not impossible, to form interconnects of the desired size on the device.

One common type of electronic device found on a microchip is a diode. A diode functions as a type of electrical gate or switch. An ideal diode will allow an electrical current to flow through the diode in one direction but will not allow the electrical current to flow through the diode in the opposite direction. In conventional diodes, however, a small amount of current flows in the opposite direction. This is referred to as current leakage.

Conventional diodes are typically formed from a silicon material that is modified through a doping process. Doping is a process in which ions are diffused or implanted within the silicon and then activated. There are two general types of dopants: P-type dopants and N-type dopants. P-type dopants produce positive charged holes. In contrast, N-type dopants produce extra electrons with negative charges. In general, a semiconductor diode is formed when a material doped with a P-type dopant is placed adjacent to a material with an N-type dopant.

Conventionally, diodes are configured by positioning the two opposing doped materials side-by-side on a microchip. This side-by-side positioning, however, uses a relatively large amount of surface area on a microchip. As a result, larger microchips are required.

Furthermore, for a diode to operate, each side of the diode must have an electrical connection that either brings electricity to or from the diode. The minimal size of each side of the diode is in part limited in that each side must be large enough to accommodate an electrical connection. Since conventional diodes have a side-by-side configuration with each side requiring a separate electrical connection, the ability to miniaturize such diodes is limited. In addition, the requirement of having side-by-side electrical connections on a single diode increases the size and complexity of the microchip.

In order to rectify some of these shortcomings, various attempts have been made to form a vertical diode structure. For example, U.S. patent application Ser. No. 12/434,212 (now U.S. Pat. No. 8,034,716) to Gonzalez et al. titled Method of Making Semiconductor Structures Including Vertical Diode Structures, hereinafter referred to as "Gonzalez" and the disclosure of which is incorporated herein in its entirety by reference, describes one method of making a vertical diode structure. However, such vertical diode structures are formed using a polysilicon material which has a poor $I_{on}/I_{off}$ performance due to the low carrier mobility through the polysilicon material. Current leaks may also form at a grain boundary of the polysilicon material, thus also decreasing the $I_{on}/I_{off}$ performance of the diode. The method of forming such vertical diodes, as described in Gonzalez, also does not provide an adequate means of forming an electrical contact for the diode when the diode is miniaturized, such as when the width of the diode is less than about 20 nm.

Accordingly, there is a need for a method of forming a vertical semiconductor device including a diode which provides high $I_{on}/I_{off}$ performance and provides for easy accessibility of an electrical contact, such as a conductive strap, to the diode. Additionally, there is a need for a method of forming such diodes as part of a semiconductor device wherein the diode may be formed over a first electronic device without damaging the first electronic device.

DETAILED DESCRIPTION

Figure 1:
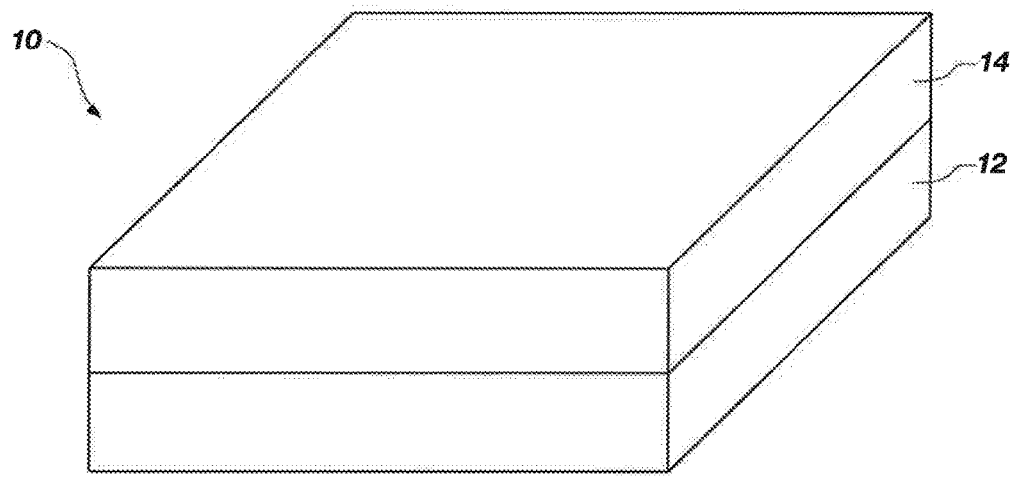
FIGS. 1-8 are partial perspective views of a semiconductor device including a diode and a conductive strap during various processing acts in accordance with one embodiment of the disclosure.

A diode structure over a conductive strap, devices including such structures, and methods of forming such a structure are disclosed. The diode structure includes, for example, a conductive strap formed over an insulator material and a diode formed of a single crystalline silicon material formed over the conductive strap. The diode may be a vertical diode structure having a first doped region formed over the conductive strap and a second doped region formed over the first doped region. A memory cell may be formed over the diode. Methods of forming such structures include forming a base structure including a second semiconductor substrate having a first doped region and a second doped region, a conductive material, an adhesion material, and an insulator material over a first semiconductor substrate. A portion of the second semiconductor substrate, the conductive material, and the adhesion material may be removed to form the conductive strap and the diode structure.

The diode structures formed in accordance with the various embodiments of the disclosure are formed of a single crystalline silicon material. In contrast, conventional diodes are formed of a polysilicon material. Such conventional diodes exhibit poor $I_{on}/I_{off}$ performance due to the low carrier mobility in the polysilicon material and current leaks, which typically form at the boundaries of the silicon grains. By forming the diode from a single crystalline silicon material, the $I_{on}/I_{off}$ performance of the diode may be improved as the single crystalline silicon material has greater ion mobility than polysilicon material. In addition, current leaks are less likely to form within the single crystalline silicon material. Additionally, because single crystalline silicon material is stronger than polysilicon material, the diodes formed from the single crystalline silicon material may be smaller than a diode formed of polysilicon material.

The methods for forming the diode structures in accordance with various embodiments of the disclosure include forming a second semiconductor substrate overlying a conductive material. Because the conductive material, which may be used to form a conductive strap, is buried beneath the second semiconductor substrate, the diode structure may be formed in the second semiconductor substrate in relatively few process acts, as described in greater detail below. For example, in one embodiment, a cross point array including a plurality of diodes having a memory cell formed on each diode may be formed in as few as two patterning and etching acts. Furthermore, because the diode structures are formed over the conductive strap, the diode structures may be self-aligned with the conductive strap and, thus, contact resistance caused by misalignment between the diode and the conductive strap may be reduced. The memory cell and the diode may also be self aligned, thus decreasing contact resistance caused by misalignment between the diode and the memory cell.

The diode structures formed in accordance with various embodiments of the disclosure may be used to fabricate a variety of semiconductor devices, such as an integrated circuit including a logic device formed in/on the first semiconductor substrate and a memory device including the diode structure formed in/on the second semiconductor substrate. Since a logic device may be formed on the first semiconductor substrate before the memory device including the diode structure is formed, the memory device is not exposed to the processing conditions used for the formation of the logic device. By forming such vertical integrated circuits, the cell size may be reduced, which provides for increased cache memory density. The diode structures formed in accordance with various embodiments of the disclosure may be used to form, for example, flash memory, imagers, and phase change memory (PCRAM).

The following description provides specific details, such as material types and processing conditions, in order to provide a thorough description of embodiments of the present invention. However, a person of ordinary skill in the art will understand that the embodiments of the present invention may be practiced without employing these specific details and in conjunction with conventional fabrication techniques. In addition, the description provided herein does not form a complete process flow for manufacturing a semiconductor device including the diode structure. Only those process acts and structures necessary to understand the embodiments of the present invention are described in detail below. Additional acts to form a complete semiconductor device including the diode structure according to an embodiment of the invention may be performed by conventional techniques.

The materials described herein may be formed by any suitable technique including, but not limited to, spin coating, blanket coating, chemical vapor deposition ("CVD"), plasma enhanced chemical vapor deposition ("PECVD"), atomic layer deposition ("ALD"), plasma enhanced ALD, or physical vapor deposition ("PVD"). Alternatively, materials may be grown in situ. A technique suitable for depositing or growing a particular material may be selected by a person of ordinary skill in the art. While the materials described and illustrated herein may be formed as layers, the materials are not limited thereto and may be formed in other three-dimensional configurations.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular system, logic device, memory cell, or semiconductor device, but are merely idealized representations which are employed to describe the present invention. The drawings presented herein are not necessarily drawn to scale. Additionally, elements common between drawings may retain the same numerical designation.

Figure 2:
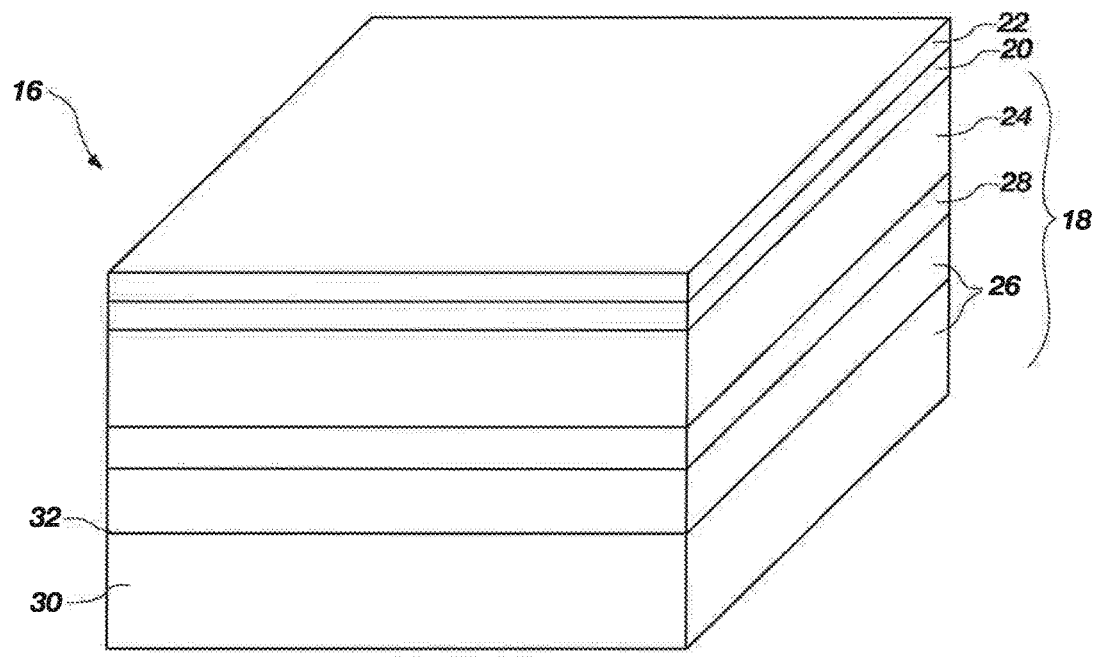

Referring now to the drawings, where like elements are designated by like reference numerals, FIGS. 1 through 8 are partial perspective views of a method of forming an embodiment of a semiconductor device 100 (FIG. 8) of the present invention. The semiconductor device 100 (FIG. 8) may be formed using a semiconductor structure 34 (FIG. 4), also referred to herein as a base structure 34, which is formed by bonding an acceptor wafer 10 (FIG. 1) and a donor wafer 16 (FIG. 2). Forming such base structures 34 are described in detail in U.S. patent application Ser. No. 12/715,704 filed on Mar. 2, 2010, and titled "SEMICONDUCTOR-METAL-ON-INSULATOR STRUCTURES, METHODS OF FORMING SUCH STRUCTURES, AND SEMICONDUCTOR DEVICES INCLUDING SUCH STRUCTURES". While FIGS. 1 through 4 illustrate one example of a method of forming the base structure 34, any of the methods described in U.S. patent application Ser. No. 12/715,704, or other known methods, may be utilized to form the base structure 34.

FIG. 1 depicts the acceptor wafer 10. The acceptor wafer 10 may include a first semiconductor substrate 12 having an insulator material 14 formed thereon. The first semiconductor substrate 12 may include a fabrication substrate, such as a full or partial wafer of semiconductor material (e.g., silicon, gallium arsenide, indium phosphide, etc.), a full or partial silicon-on-insulator (SOI) type substrate, such as a silicon-on-glass (SOG), silicon-on-ceramic (SOC), or silicon-on-sapphire (SOS) substrate, or any other known, suitable fabrication substrate. As used herein, the term "wafer" includes conventional wafers as well as other bulk semiconductor substrates. The first semiconductor substrate 12 may be doped or undoped. An at least partially fabricated logic device (not shown), such as a CMOS (complementary metal-oxide semiconductor) device, may optionally be present on the first semiconductor substrate 12 and may be formed by conventional techniques. In one embodiment, the first semiconductor substrate 12 is bulk crystalline silicon.

The insulator material 14 may be a dielectric material including, by way of non-limiting example, silicon dioxide, borophosphosilicate glass (BPSG), borosilicate glass (BSG), phosphosilicate glass (PSG), or the like. In one embodiment, the insulator material 14 is an oxide. The insulator material 14 may be from about 500 Å thick to about 2 μm thick, such as from about 1000 Å to about 2000 Å. Techniques for deposition and in situ growth of such dielectric materials are known in the art and may include, for example, chemical vapor deposition (CVD), such as low pressure CVD or plasma enhanced CVD, atomic layer deposition (ALD), spin-on deposition, thermal decomposition, or thermal growth.

Figure 4:
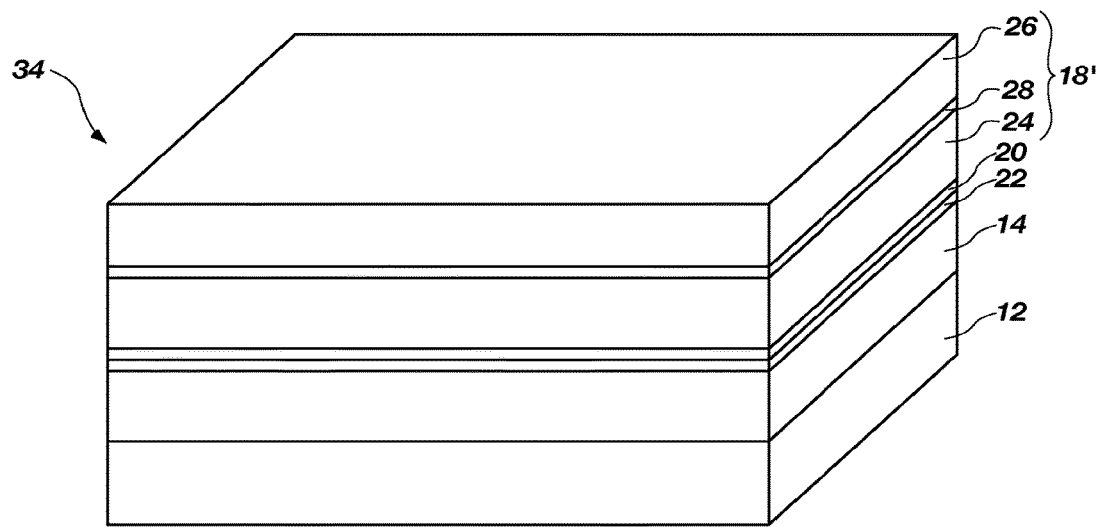

FIG. 2 is a partial perspective view of one embodiment of the donor wafer 16 used to form the base structure 34 (FIG. 4). The donor wafer 16 may include a precursor semiconductor substrate 18 formed of a single crystalline silicon material. A conductive material 20 and an adhesion material 22 may be formed over the precursor semiconductor substrate 18. The precursor semiconductor substrate 18 may, initially, be doped or undoped. By way of example, the precursor semiconductor substrate 18 may initially be a single crystalline silicon material that is undoped or intrinsically doped. The precursor semiconductor substrate 18 may then be doped, or further doped, to include a first doped region 24, a second doped region 26, and a lightly doped region 28. These doped regions may ultimately form the diode. The first doped region 24 and the second doped region 26 may be doped with P-type or N-type dopants such that the first doped region 24 and the second doped region 26 are oppositely doped. For example, in one embodiment, the first doped region 24 is an N-type single crystalline silicon material and the second doped region 26 is a P-type single crystalline silicon material. Alternatively, in another embodiment, the first doped region 24 is a P-type single crystalline silicon material and the second doped region 26 is an N-type single crystalline silicon material. A lightly doped region 28 may be formed between the first doped region 24 and the second doped region 26. The lightly doped region 28 may be doped with the same dopant as the second doped region 26, but the lightly doped region 28 may have a lower concentration of dopant than the second doped region 26. For example, the second doped region 26 may be doped with a higher concentration of the P-type dopant and the lightly doped region 28 may be doped with a lower concentration of the P-type dopant. If the first doped region 24 is an N-type single crystalline silicon material, a Schottky diode may be formed at an interface between the first doped region 24 and the conductive material 20, as known in the art. While the doped regions 24, 26, and 28 are described as being formed before the donor wafer 16 and acceptor wafer 10 are bonded, doping of the precursor semiconductor substrate 18 to form these regions may be conducted after the donor wafer 16 and the acceptor wafer 10 are bonded.

The doped regions 24, 26, and 28 may be formed by a doping technique known in the art, such as diffusion or ion implantation techniques. By way of example, if the first doped region 24 is an N-type single crystalline silicon material, the first doped region 24 may be formed by implanting ions of an N-type impurity, such as arsenic (As), phosphorous (P) or antimony (Sb), into the precursor semiconductor substrate 18. If the second doped region 26 is a P-type single crystalline silicon material, the second doped region 26 may be formed by implanting ions of a P-type impurity, such as boron (B), into the precursor semiconductor substrate 18. As known in the art, the depth to which the ions are implanted into the precursor semiconductor substrate 18 is at least partially a function of the implant dose and energy. The depth of the implanted ions within the precursor semiconductor substrate 18 may correspond to a desired thickness of the first doped region 24 and the second doped region 26. The first doped region 24 and the second doped region 26 may be formed before or after the conductive material 20 and the adhesion material 22 have been formed on the donor wafer 16. The lightly doped region 28 may be doped using the same dopant as the second doped region 26, except that a lower concentration of the dopant is implanted, such as by adjusting the implant dose or implant energy.

The conductive material 20 may be a low resistivity conductive material including, but not limited to, a phase change material, titanium, titanium silicide, titanium oxide, titanium nitride, tantalum, tantalum silicide, tantalum oxide, tantalum nitride, tungsten, tungsten silicide, tungsten oxide, tungsten nitride, other metals, metal silicide, metal oxide, or metal nitride materials, or combinations thereof, including multiple, different conductive materials. In one embodiment, the conductive material 20 is formed from titanium nitride because titanium nitride has good adherence or adhesion to many materials, such as the single crystalline silicon material used as the precursor semiconductor substrate 18. Titanium nitride also has a high melting point (about 3000° C.), which makes it unaffected by high processing temperatures. Titanium nitride also makes excellent ohmic contact with other conductive materials. Titanium nitride is also commonly used in semiconductor fabrication and, therefore, may easily be incorporated into conventional fabrication processes. In one embodiment, the conductive material 20 is a titanium-rich titanium nitride, such as metal mode titanium nitride (MMTiN). The conductive material 20 may also be formed from multiple conductive materials. By way of non-limiting example, the conductive material 20 may be formed from a metal, such as titanium, tungsten or aluminum, with a layer of titanium material formed thereon. The thickness of the conductive material 20 may be optimized, depending on the material, to provide a low ohmic contact. For example, if the conductive material 20 is titanium nitride, such as MMTiN, the conductive material 20 may have a thickness of from about 10 nm to about 50 nm. The conductive material 20 may be formed by a deposition technique known in the art, such as, for example, ALD, CVD, or PVD.

The adhesion material 22 may include, for example, an amorphous material, such as an amorphous silicon material or an amorphous germanium material. The adhesion material 22 may be formed over the conductive material 20 by a deposition technique known in the art, such as, for example, ALD, CVD, or PVD. In one embodiment, the adhesion material 22 may be formed on the conductive material 20 by PVD, followed by chemical-mechanical planarization (CMP). The adhesion material 22 may be of sufficient thickness to adhere to the insulator material 14 of the acceptor wafer 10 as described in greater detail below. For example, the thickness of the adhesion material 22 may be from about 10 nm to about 50 nm.

Figure 7:
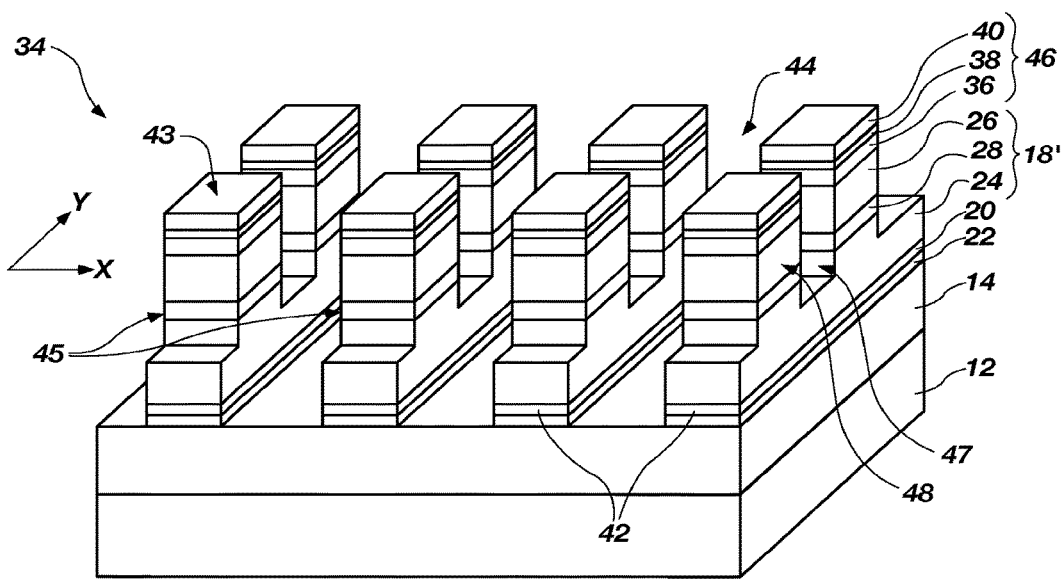

The donor wafer 16 may also include a cleave portion 30 formed by implanting an atomic species into the precursor semiconductor substrate 18. The atomic species may be hydrogen ions, ions of rare gases, also termed inert or noble gases, or ions of fluorine. The atomic species may be implanted into the precursor semiconductor substrate 18 of the donor wafer 16 to form an implanted zone 32. The atomic species may be implanted into the precursor semiconductor substrate 18 prior to formation of the conductive material 20 thereon, after formation of the conductive material 20 thereon, or after formation of the adhesion material 22 thereon. The implanted zone 32 may be formed at a desired depth in the precursor semiconductor substrate 18, which is dependent on parameters such as implant dose and energy of the atomic species, as known in the art. The location of the implanted zone 32 may correspond to a height of a diode 48 ultimately formed from the precursor semiconductor substrate 18, as shown in FIG. 7. The implanted zone 32 may include microbubbles or microcavities including the implanted atomic species, which provide a weakened region within the precursor semiconductor substrate 18. The donor wafer 16 may be thermally treated at a temperature above that at which implantation is effected, but below the melting temperature of the conductive material 20, to effect crystalline rearrangement in the donor wafer 16 and coalescence of the microbubbles or microcavities. As described below, the donor wafer 16 may be cleaved at the implanted zone 32, forming the second semiconductor substrate 18' on the base structure 34 (FIG. 4) and cleave portion 30. For convenience and clarity, the term "second semiconductor substrate" is used herein to refer to the semiconductor structure after removal of the cleave portion 30, while the term "precursor semiconductor substrate" is used herein to refer to the semiconductor structure before removal of the cleave portion 30.

Figure 3:
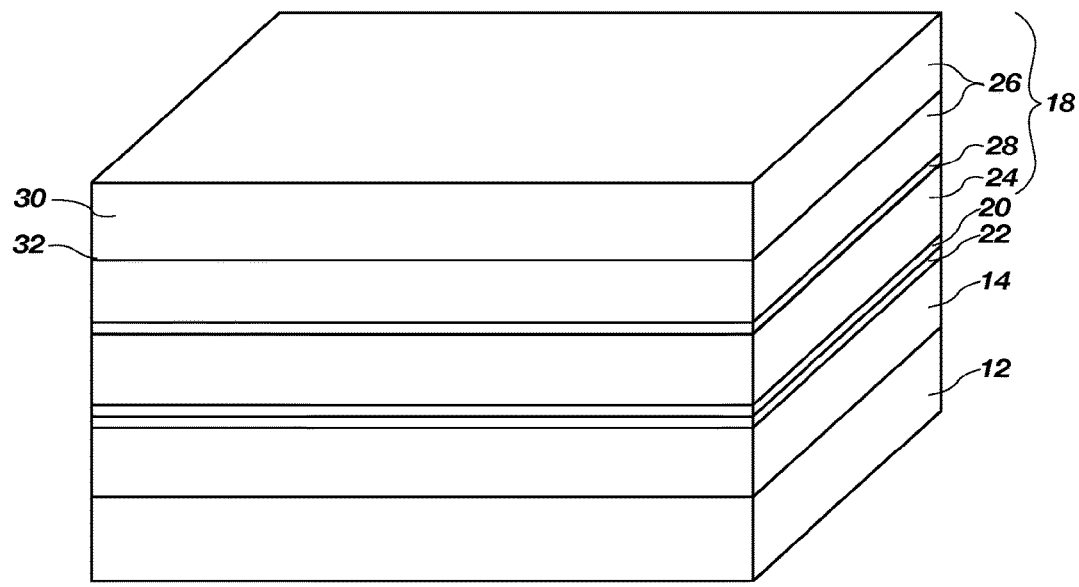

As shown in FIG. 3, the donor wafer 16 (FIG. 2) may be superposed onto the acceptor wafer 10 (FIG. 1) such that the adhesion material 22 of the donor wafer 16 is in contact with the insulator material 14 of the acceptor wafer 10. The adhesion material 22 of the donor wafer 16 may then be bonded to the insulator material 14 of the acceptor wafer 10 by exposure to heat. Prior to bonding the donor wafer 16 to the acceptor wafer 10, at least one of the adhesion material 22 and the insulator material 14 may, optionally, be treated to improve the bond strength between the adhesion material 22 and the insulator material 14. Such treatment techniques are known in the art and may include chemical, plasma, or implant activations. For example, the insulator material 14 may be treated with a dilute ammonia hydroxide or hydrogen fluoride solution. The adhesion material 22 may also be exposed to a plasma of, for example, argon, to form a plasma-activated surface. Activating at least one of the adhesion material 22 and the insulator material 14 may increase the kinetics of the subsequent bonding therebetween As shown in FIG. 3, the adhesion material 22 of the donor wafer 16 may be contacted and bonded with the insulator material 14 of the acceptor wafer 10 to form a precursor of the base structure 34 (FIG. 4). The adhesion material 22 may be bonded to the insulator material 14 by, for example, heating the base structure 34 to a temperature of less than about 600° C., such as from about 300° C. to about 400° C. If the insulator material 14 is formed from silicon dioxide, silicon-oxide bonds may form between the adhesion material 22 and the insulator material 14. Because the conductive material 20 may be formed of a metal or other heat sensitive material, the temperature to which the base structure 34 is exposed may be less than the melting point of the conductive material 20. The adhesion material 22 and the insulator material 14 may also be bonded without heat, such as at ambient temperature (from about 20° C. to about 25° C.). Pressure may also be applied to the donor wafer 16 and the acceptor wafer 10 to bond the adhesion material 22 to the insulator material 14. Once the donor wafer 16 is bonded to the acceptor wafer 10, the conductive material 20 from the donor wafer 16 may form a buried conductive material, which is disposed between the insulator material 14 and the precursor semiconductor substrate 18.

The cleave portion 30 may then be removed from the precursor semiconductor substrate 18 to form the base structure 34 shown in FIG. 4. The cleave portion 30 may be removed by techniques known in the art, such as by applying a shear force to the implanted zone 32 or by applying heat or a jet gas stream at the implanted zone 32. The hydrogen or other ions implanted in implanted zone 32 produce a weakened region in the precursor semiconductor substrate 18, which is susceptible to cleavage. The remaining portion of the precursor semiconductor substrate 18 (second semiconductor substrate 18') may have a thickness, for example, of from about 50 nm to about 500 nm (from about 500 Å to about 5000 Å). The second semiconductor substrate 18' of the base structure 34 may be smoothed according to conventional techniques such as, for example, one or more of grinding, wet etching, and chemical-mechanical planarization (CMP).

The base structure 34 may be formed by modification of SMART-CUT® layer transfer technology. The SMART-CUT® layer transfer technology is described in detail in, for example, U.S. Pat. No. RE 39,484 to Bruel, U.S. Pat. No.

6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., and U.S. Patent Application Publication No. 2006/0099776 to DuPont. However, other processes suitable for manufacturing a semiconductor substrate having a buried conductive material may also be used, if sufficiently low process temperatures are maintained. In conventional implementation of the SMART-CUT® layer transfer technology, donor wafers and acceptor wafers are bonded together using a high temperature anneal. The temperature used to bond the donor and acceptor wafers is from about 1000° C. to about 1300° C. However, due to the presence of the conductive material 20 in the semiconductor structures described herein, the semiconductor structures of the present invention may, in some embodiments, be unable to withstand exposure to such temperatures without thermal damage. Accordingly, as described above, lower temperatures may be used to bond an acceptor wafer 10 and donor wafer 16.

Figure 5:
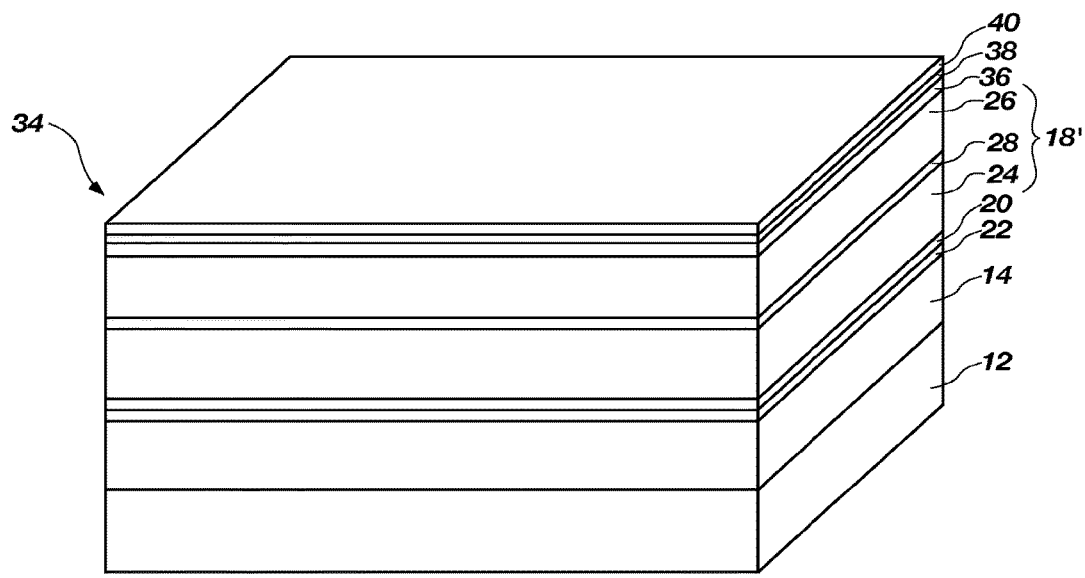

As shown in FIG. 5, a bottom electrode 36, a memory medium 38, and a top electrode 40 may be formed over the second semiconductor substrate 18'. If the second semiconductor substrate 18' were not previously doped, as described above, the second semiconductor substrate 18' may be doped prior to forming the bottom electrode 36, the memory medium 38, and the top electrode 40. The bottom electrode 36 may be formed from a conductive material, such as titanium, titanium silicide, titanium nitride, tungsten, tungsten silicide, tungsten nitride, or combinations thereof. In one embodiment, the bottom electrode 36 is MMTi, titanium, MMTi/titanium nitride, or titanium/titanium nitride. The bottom electrode 36 may be formed over the second semiconductor substrate 18' using a deposition technique known in the art, such as, for example, ALD, CVD, or PVD. The memory medium 38 may be formed of any medium capable of holding distinct detectable states. By way of non-limiting example, the memory medium 38 may be formed of a transition metal material, such as nickel oxide or copper oxide, a phase change material, such as a chalcogenide material, or a resistive oxide material. For example, the memory medium 38 may be formed of a chalcogenide material having the formula $Ge_xSb_yTe_z$ wherein the ratio of x:y:z=2:2:5, commonly referred to as GST. Additional examples of the memory medium 38 include a conductive oxide material, a solid electrolyte material, an antifuse oxide material, an ovonic material, or a ferroelectric material. The memory medium 38 may also be formed by a deposition technique known in the art, such as, ALD, CVD, or PVD. The top electrode 40 may be formed of a conductive material similar to the bottom electrode 36.

Figure 6:
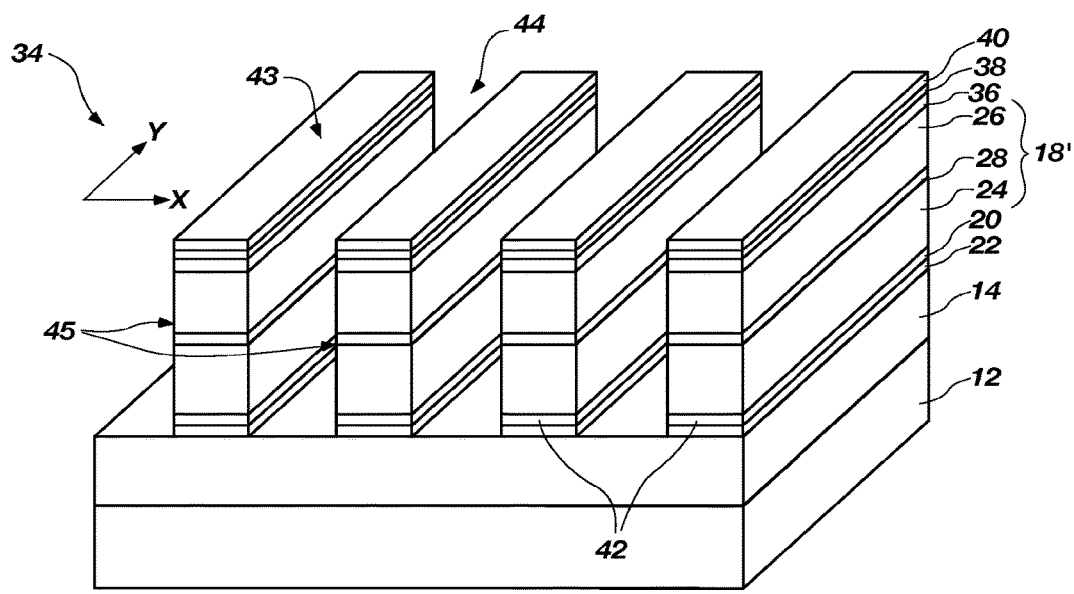
Figure 8:
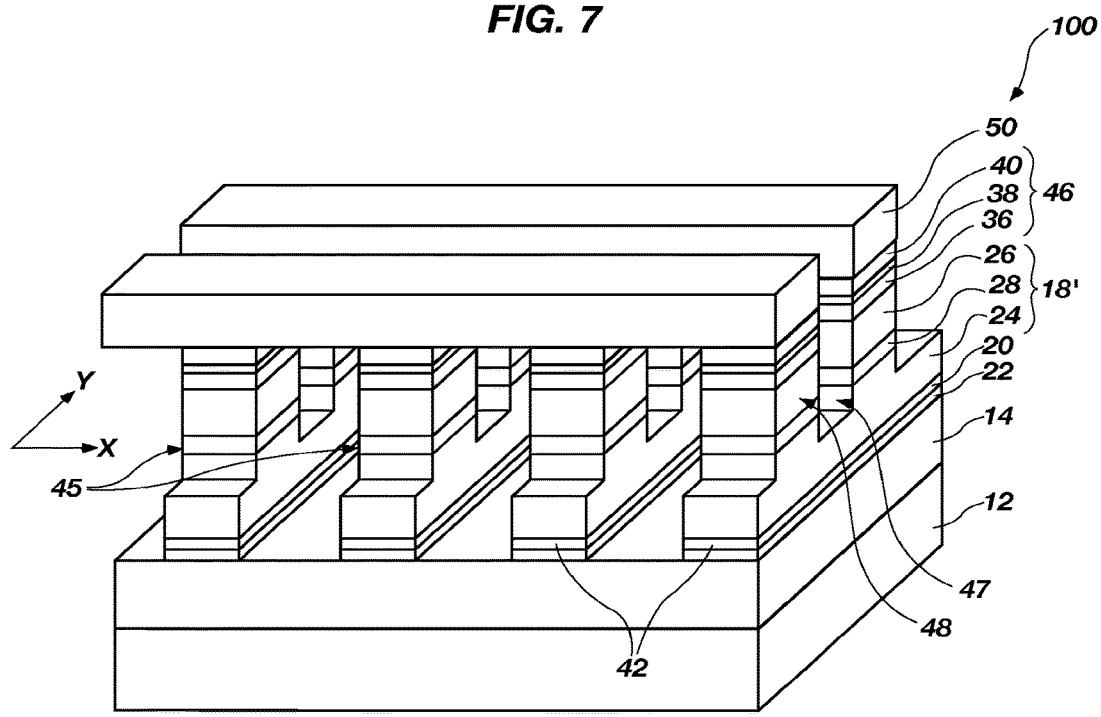

As shown in FIGS. 6 and 7, a two mask process may be used to define a cross point array including at least one diode 48 having a memory cell 46 thereon formed over a conductive strap 42. Referring to FIG. 6, the top electrode 40, the memory medium 38, the bottom electrode 36, the second semiconductor substrate 18', the conductive material 20, and the adhesion 22 material may be patterned using a single mask to form pillars 45 having at least one first trench 44 there between. As shown in FIG. 6, the top electrode 40, the memory medium 38, the bottom electrode 36, the second semiconductor substrate 18', the conductive material 20, and the adhesion material 22 may be patterned and etched in a first direction Y, as described in greater detail below. The conductive material 20 underlying the pillars 45 forms the conductive strap 42, which may also function as a word line in the semiconductor device 100 (FIG. 8).

The pillars 45 may be formed by depositing a mask material (not shown) over the top electrode 40 and patterning the mask material to form apertures through which surfaces of the top electrode 40 are exposed. The mask material may include, for example, a photoresist material, an oxide material, transparent carbon, or amorphous carbon. Methods of forming and patterning the mask material are known in the art and, therefore, are not described in detail herein. The pattern in the mask material may then be transferred to the underlying materials using dry or wet etch techniques. By way of non-limiting example, an anisotropic reactive ion (i.e., plasma) etching or reactive ion etching (RIE) process may be used. The etch technique may be selected by a person of ordinary skill in the art based on the material to be removed. Multiple materials may also be removed simultaneously, depending on the similarity in materials. The techniques for removing the underlying materials are conventional and, therefore, are not described in detail herein. The removed portions of the top electrode 40, the memory medium 38, the bottom electrode 36, the second semiconductor substrate 18', the conductive material 20, and the adhesion material 22 may form the at least one first trench 44. The portions of each of the top electrode 40, the memory medium 38, the bottom electrode 36, the second semiconductor substrate 18', the conductive material 20, and the adhesion material 22 remaining under the mask material form the pillars 45. The conductive material 20 at the bottom of the pillars 45 forms the conductive strap 42. A portion of the insulator material 14 may also be etched in order to ensure complete electrical isolation of adjacent conductive straps 42 from one another. The remaining portions of the mask material overlying the pillars 45 may then be removed. By way of non-limiting example, the at least one first trench 44 may be formed extending in a first direction Y through each of the top electrode 40, the memory medium 38, the bottom electrode 36, the second semiconductor substrate 18', the conductive material 20, and the adhesion material 22. For example, if the top electrode 40, the bottom electrode 36, and the conductive material 20 are each formed from titanium nitride, a mixture of bromine-containing gas and a fluorine-containing gas or a mixture of a fluorine-containing gas and a chlorine-containing gas may be used to remove each of these titanium nitride materials and the adhesion material 22 selective to the mask material and the insulator material 14. The second semiconductor substrate 18' may be selectively removed using a reactive ion etching (RIE) process using oxygen ($O_2$) gas and tetrafluoromethane ($CF_4$) gas. A fill material (not shown) may be formed in the at least one first trench 44 and subject to CMP so that an upper surface 43 of the base structure 34 is substantially planar. The fill material may include, for example, a dielectric material such as an oxide material, a nitride material, or a spin-on-glass (SOG) material, and may be deposited using a chemical vapor deposition process.

As shown in FIG. 7, portions of the top electrode 40, the memory medium 38, the bottom electrode 36, and the second semiconductor substrate 18' may be patterned using a second mask to form at least one diode 48 having a memory cell 46 formed thereon. The diode 48 includes the first doped region 24, the lightly doped region 28, and the second doped region 26. The memory cell 46 includes the bottom electrode 36, the memory medium 38, and the top electrode 40. At least one second trench 47 may be formed between adjacent diodes 48 over a common conductive strap 42. To form the diodes 48, the top electrode 40, the memory medium 38, the bottom electrode 36, and the second semiconductor substrate 18' including the second doped region 26, the lightly doped region 28 and a portion of the first doped region 24 may be patterned and etched in a second direction X to form at least one second trench 47, as described in greater detail below. The second direction X may be substantially perpendicular to the first direction Y. As shown in FIG. 7, the diode 48 is self-aligned with the conductive strap 42 thus eliminating the need for a separate electrical contact between the diode 48 and the conductive strap 42. Similarly, the memory cell 46 is self-aligned with the diode 48, which eliminates the need for a separate electrical contact between the memory cell 46 and the diode 48. The aspect ratio of each diode 48 may be from about 2:1 to about 20:1 and, more particularly, from about 5:1 to about 10:1. The width of each diode 48 may be from about 5 nm to about 50 nm and, more particularly, from about 10 nm to about 20 nm. Because the diode 48 is formed of a single crystalline silicon material rather than a polysilicon material, the diode 48 may have a smaller width and height than a diode formed of polysilicon material.

Conventional diodes formed of a polysilicon material have a lower carrier mobility than and experience a greater occurrence of leaks along the grain boundary, thus providing a lower performance than a diode formed of a single crystal silicon material. Additionally, because the diode 48 is formed of a single crystalline silicon material, the diode 48 may have a greater ability to transfer ions than a diode formed from polysilicon and, therefore, will have a greater $I_{on}/I_{off}$ performance than a polysilicon diode.

Each diode 48 and memory cell 46 may be formed by depositing a mask material (not shown) over the top electrode 40 and the fill material (not shown) and patterning the mask material to form apertures through which surfaces of the top electrode 40 are exposed. Optionally, surfaces of the fill material (not shown) may also be exposed through the mask material. The mask material may include, for example, a photoresist material, an oxide material, transparent carbon or amorphous carbon. Methods of forming and patterning the mask material are known in the art and, therefore, are not described in detail herein. Portions of the top electrode 40, the memory medium 38, the bottom electrode 36, and the second semiconductor substrate 18' including the second doped region 26, the partially doped region 28, and a portion of the first doped region 24 that are exposed through the apertures in the mask material may be removed to form each diode 48 and memory cell 46. For example, if the top electrode 40 and the bottom electrode 26 are each formed from titanium nitride, a mixture of bromine-containing gas and a fluorine-containing gas or a mixture of a fluorine-containing gas and a chlorine-containing gas may be used to remove each of the titanium nitride materials selective to the mask material and the insulator material 14. The second semiconductor substrate 18' may be selectively removed using a reactive ion etching (RIE) process using oxygen ($O_2$) gas and tetrafluoromethane ($CF_4$) gas. An additional fill material (not shown) may be formed in any etched portions of the at least one first trench 44 and the at least one second trench 47 and subject to CMP so that the upper surface 43 of the base structure 34 and the fill material are substantially planar with one another.

As shown in FIG. 8, at least one bit line 50 may be formed over the top electrode 40 of the memory cell 46. In one embodiment, the at least one bit line 50 may electrically couple more than one of the memory cell 46. For example, the bit line 50 may extend in the second direction X over adjacent memory cells 46, electrically coupling memory cells 46 on at least two distinct conductive straps 42. The bit line 50 may be formed by depositing a conductive material over the semiconductor base 34 (FIG. 7) and patterning the conductive material to form substantially straight and substantially parallel bit lines 50. The bit line 50 may patterned and etched, as known in the art, in the second direction X to expose the at least one second trench 47.

The resulting semiconductor device 100 shown in FIG. 8 includes a cross-point diode memory array including the first semiconductor substrate 12, the insulator material 14, the adhesion material 22 bonded to the insulator material 14, the conductive material 20 over the adhesion material 22, wherein the conductive material 20 and the adhesion material 22 form at least two conductive straps 42, a plurality of diodes 48 formed over the at least two conductive straps 42, a memory cell 46 formed on each of the plurality of diodes 48, and a bit line 50 formed over the memory cells 46.

Figure 9:
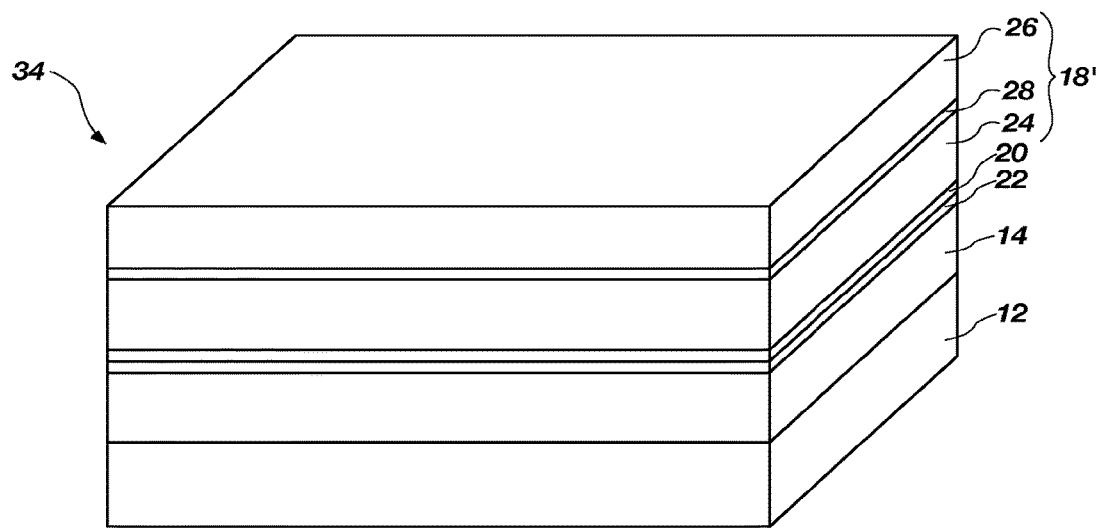
FIGS. 9-14 are partial perspective views of a semiconductor device including a diode and a conductive strap during various processing acts in accordance with one embodiment of the disclosure.

FIGS. 9-14 illustrate another method of forming a semiconductor device 200 (FIG. 14) of the present invention. FIG. 9 illustrates a base structure 34, which is a substantial duplication of FIG. 4 and may be formed as described above regarding FIGS. 1-4. As shown in FIG. 9, the base structure 34 includes a first semiconductor substrate 12, an insulator material 14, an adhesion material 22, a conductive material 20, and a second semiconductor substrate 18' including a first doped region 24, a lightly doped region 28, and a second doped region 26.

Figure 10:
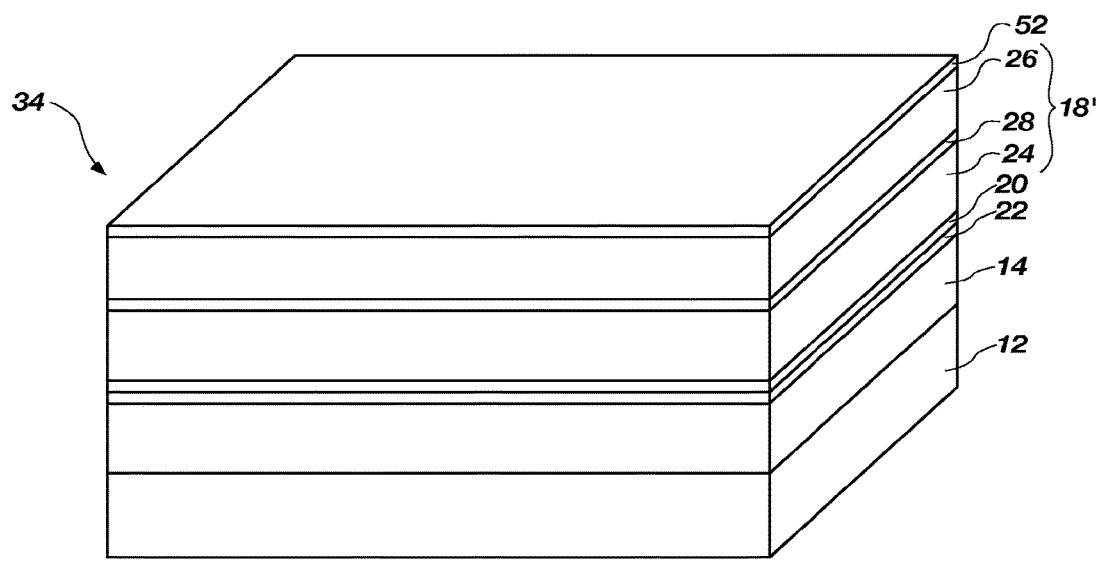

As shown in FIG. 10, a bottom electrode 52 may be formed over the second semiconductor substrate 18'. If the second semiconductor substrate 18' was not previously doped, as described above, the second semiconductor substrate 18' may be doped prior to forming the bottom electrode 52. The bottom electrode 52 may be formed from a conductive material, such as titanium, titanium silicide, titanium nitride, tungsten, tungsten silicide, tungsten nitride, or combinations thereof. In one embodiment, the bottom electrode 52 is MMTi, titanium, MMTi/titanium nitride, or titanium/titanium nitride. The bottom electrode 52 may be formed on the second semiconductor substrate 18' using a deposition technique known in the art, such as, for example, ALD, CVD, or PVD.

Figure 11:
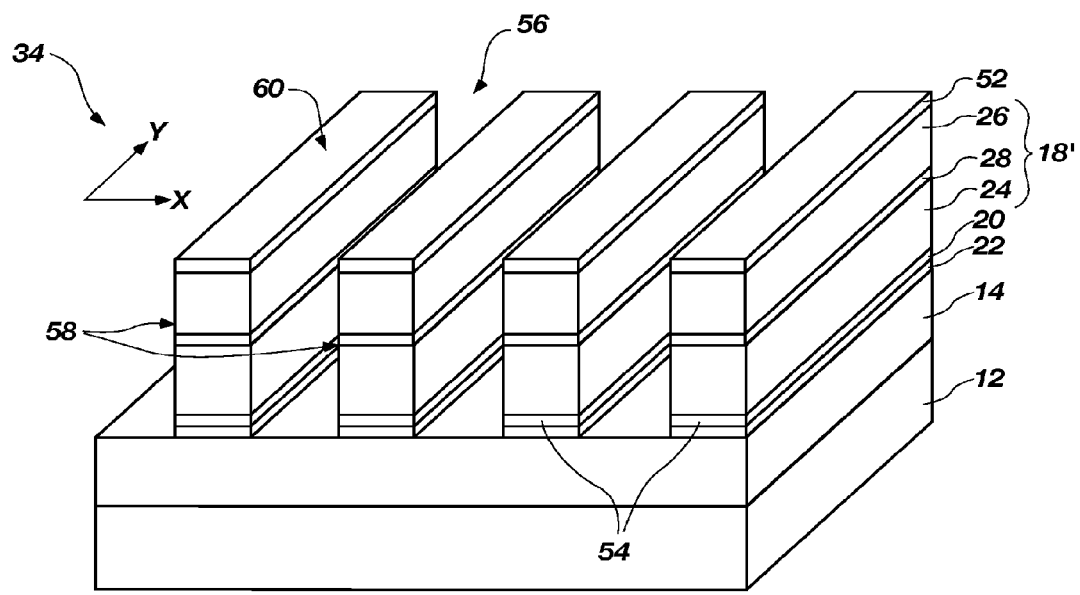
Figure 12:
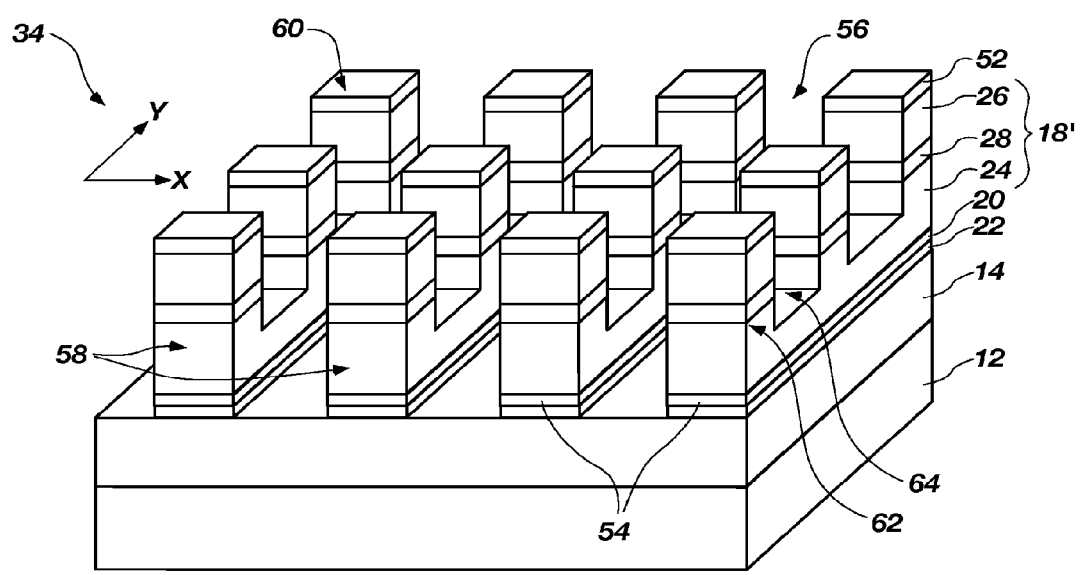
Figure 14:
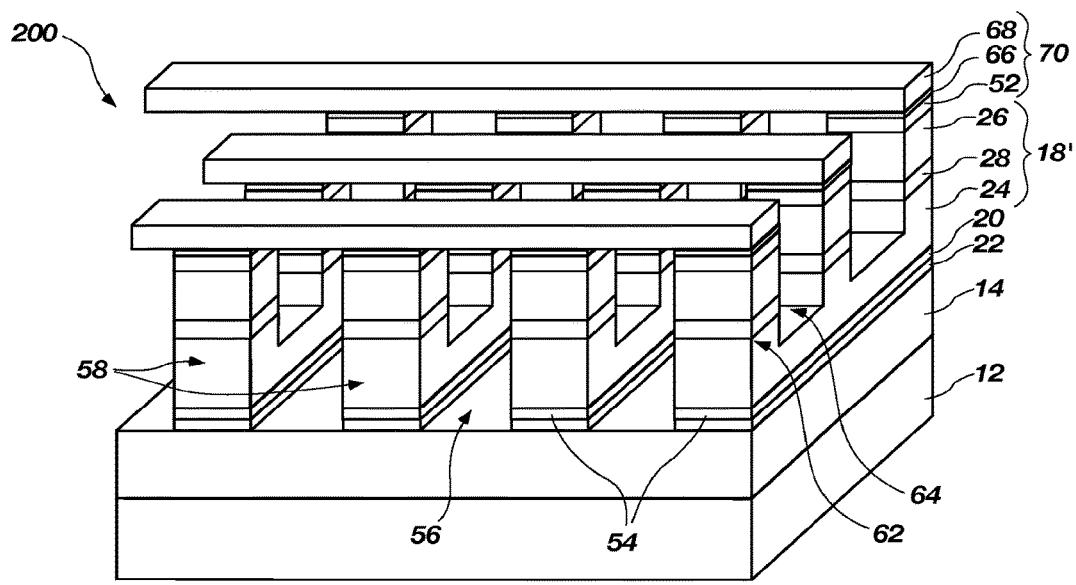

As shown in FIGS. 11 and 12, a two mask process may be used to define a cross point array including at least one diode 62 having a bottom electrode 52 thereon formed over a conductive strap 54. Referring to FIG. 11, the bottom electrode 52, the second semiconductor substrate 18', the conductive material 20, and the adhesion material 22 may be removed using a first mask to form pillars 58 having trenches 56 there between. To form the pillars 58, the bottom electrode 52, the second semiconductor substrate 18', the conductive material 20, and the adhesion material 22 may be patterned and etched in a first direction Y as described in greater detail below. The conductive material 20 underlying the pillars 58 forms the conductive strap 54, which may also function as a word line in the semiconductor device 200 (FIG. 14).

The pillars 58 may be formed by depositing a mask material (not shown) over the bottom electrode 52 and patterning the mask material to form apertures through which surfaces of the bottom electrode 52 are exposed. The mask material may include, for example, a photoresist material, an oxide material, transparent carbon or amorphous carbon. Methods of forming and patterning the mask material are known in the art and, therefore, are not described in detail herein. The pattern in the mask material may then be transferred to the underlying materials using dry or wet etch techniques. By way of non-limiting example, an anisotropic reactive ion (i.e., plasma) etching or reactive ion etching (RIE) process may be used. The etch technique may be selected by a person of ordinary skill in the art based on the material to be removed. Multiple materials may also be removed simultaneously, depending on the similarity in materials. The techniques for removing the underlying materials are conventional and, therefore, are not described in detail herein. The removed portions of the bottom electrode 52, the second semiconductor substrate 18', the conductive material 20, and the adhesion material 22 may form the trenches 56. The portions of each of the bottom electrode 52, the second semiconductor substrate 18', the conductive material 20, and the adhesion material 22 remaining under the mask material form the pillars 58. The conductive material 20 at the bottom of the pillars 58 forms the conductive strap 54. A portion of the insulator material 14 may also be etched in order to ensure complete electrical isolation of adjacent conductive straps 54 from one another. The remaining portions of the mask material overlying the pillars 58 may then be removed. By way of non-limiting example, the trenches 56 may be formed extending in a first direction Y through each of the bottom electrode 52, the second semiconductor substrate 18', the conductive material 20, and the adhesion material 22. For example, if the bottom electrode 52 and the conductive material 20 are each formed from titanium nitride, a mixture of bromine-containing gas and a fluorine-containing gas or a mixture of a fluorine-containing gas and a chlorine-containing gas may be used to selectively remove each of these titanium nitride materials and the adhesion material 22 selective to the mask material and the insulator material 14. The second semiconductor substrate 18' may be selectively removed using a reactive ion etching (RIE) process using oxygen ($O_2$) gas and tetrafluoromethane ($CF_4$) plasma. A fill material (not shown) may be formed in the trenches 56 and subject to CMP so than an upper surface 60 of the semiconductor base 34 is substantially planar. The fill material may include, for example, a dielectric material such as an oxide material, a nitride material, or a spin-on-glass (SOG) material, and may be deposited using a chemical vapor deposition process.

As shown in FIG. 12, portions of the bottom electrode 52 and the second semiconductor substrate 18' may be removed using a second mask to form at least one diode 62 having the bottom electrode 52 formed thereon. A trench 64 may be formed between adjacent diodes 62 over a common conductive strap 54. To form the diodes 62, the bottom electrode 52 and the second semiconductor substrate 18' including the second doped region 26, the lightly doped region 28 and a portion of the first doped region 24 may be patterned and etched in a second direction X to form the trench 64 as described in greater detail below. The second direction X may be substantially perpendicular to the first direction Y. As shown in FIG. 12, the diode 62 is self aligned with the conductive strap 54, thus eliminating the need for a separate electrical contact between the diode 62 and the conductive strap 54. The aspect ratio of each diode 62 may be from about 5:1 to about 40:1 and, more particularly, from about 20:1 to about 30:1. The width of each diode 62 may be about 5 nm to about 40 nm and, more particularly, from about 10 nm to about 20 nm. Because the diode 62 is formed of a single crystalline silicon material rather than a polysilicon material, the diode 62 may have a smaller width and height than a diode formed of polysilicon material. Additionally, because the diode 62 is formed of a single crystalline silicon material, the diode 62 may have a greater ability to transfer ions than a diode formed from polysilicon, and, therefore, will have a greater $I_{on}/I_{off}$ performance than a polysilicon diode.

Each diode 62 may be formed by depositing a mask material (not shown) over the bottom electrode 52 and the fill material (not shown) and patterning the mask material to form apertures through which surfaces of the bottom electrode 52 are exposed. Optionally, surfaces of the fill material (not shown) may also be exposed through the mask material. The mask material may include, for example, a photoresist material, an oxide material, transparent carbon or amorphous carbon. Methods of forming and patterning the mask material are known in the art and, therefore, are not described in detail herein. Portions of the bottom electrode 52 and the second semiconductor substrate 18' including the second doped region 26, the partially doped region 28, and a portion of the first doped region 24 that are exposed through the apertures in the mask material may be removed to form each diode 62 having the bottom electrode 52 formed thereon. For example, if the bottom electrode 52 is formed from titanium nitride, a mixture of bromine-containing gas and a fluorine-containing gas or a mixture of a fluorine-containing gas and a chlorine-containing gas may be used to selectively remove the titanium nitride materials selective to the mask material and the insulator material 14. The second semiconductor substrate 18' may be selectively removed using a reactive ion etching (RIE) process using oxygen ($O_2$) gas and tetrafluoromethane ($CF_4$) gas. An additional fill material (not shown) may be formed in any etched portions of the trenches 56 and the trenches 64 and subject to CMP so that the upper surface 60 of the semiconductor structure and the fill material are substantially planar with one another.

Figure 13:
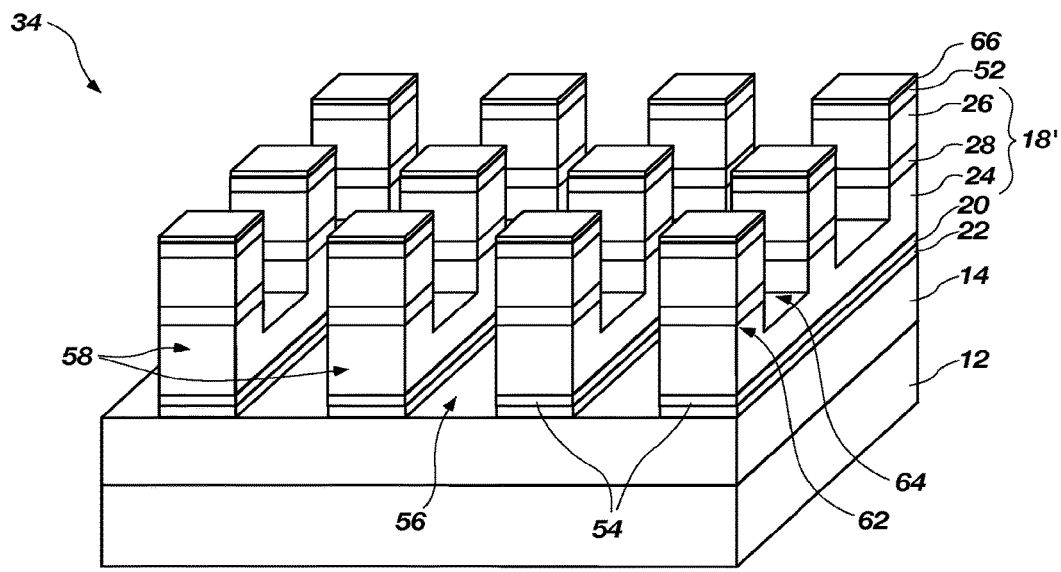

As shown in FIG. 13, a memory medium 66 may be formed over the bottom electrode 52. The memory medium 66 may be formed of any medium known in the art capable of holding a distinct detectable state or holding a charge. In one embodiment, the memory medium 66 may be formed of a phase change or resistant material such as a chalcogenide material. For example, the memory medium 66 may be formed of a chalcogenide material having the formula $Ge_xSb_yTe_z$ wherein the ratio of x:y:z=2:2:5, commonly referred to as GST. Additional examples of the memory medium 66 include a conductive oxide material, a solid electrolyte material, an antifuse oxide material, an ovonic material, and a ferroelectric material. The memory medium 66 may be formed by a deposition technique known in the art, such as, for example ALD, CVD, or PVD. In one embodiment, the memory medium 66 may be blanket deposited over the upper surface 60 (FIGS. 11 and 12) of the semiconductor structure. The memory medium 66 may then be patterned and etched as known in the art and as previously described herein such that the memory medium 66 is formed over each of the bottom electrodes 52.

As shown in FIG. 14, at least one bit line 68 may be formed over the memory medium 66. The bit line 68 may act as both a bit line and a top electrode. The bottom electrode 52, the memory medium 66, and the bit line 68 may form a memory cell 70. The at least one bit line 68 may electrically couple more than one memory cell 70. For example, the bit line 68 may extend in the second direction X over adjacent memory cells 70, electrically coupling memory cells 70 on two distinct conductive straps 54. The bit line 68 may be formed by depositing a conductive material over the base structure 34 and patterning the conductive material to form substantially straight and substantially parallel bit lines 68. In one embodiment, a fill material (not shown) may be deposited in the trenches 56 and the trenches 64 as previously described and the bit line 68 may be blanket deposited over the pillars 58 and the fill material. The bit line 68 may then be patterned and etched, as known in the art, in the second direction X to expose the trenches 64.

The resulting semiconductor device 200 shown in FIG. 14 includes a cross-point diode memory array including the first semiconductor substrate 12, the insulator material 14, the adhesion material 22 bonded to the insulator material 14, the conductive material 20 over the adhesion material 22, wherein the conductive material 20 and the adhesion material 22 form at least two conductive straps 54, a plurality of diodes 62 formed over the at least two conductive straps 54, memory cells 70 formed on each of the plurality of diodes 62, wherein the top electrode of the memory cell 70 is the bit line 68. The semiconductor device 200 formed according to FIGS. 9-14 may be substantially similar to the semiconductor device 100 formed according to FIGS. 1-8 with the exception that in the semiconductor device 200, the bit line 68 is the top electrode of the memory cell 70 while in the semiconductor device 100, the bit line 50 is electrically coupled to the top electrode 40 of the memory cell 46.

Figure 15:
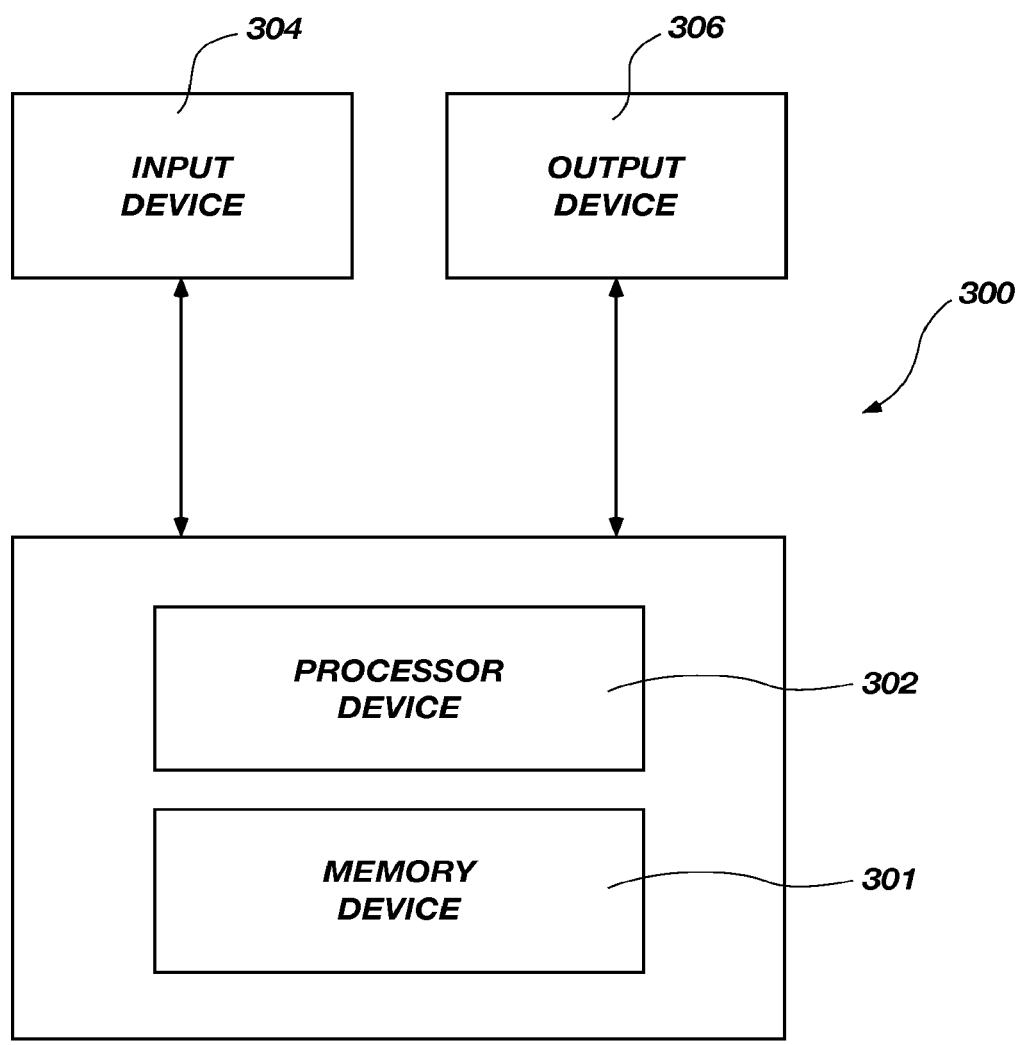
FIG. 15 is a schematic block diagram illustrating one embodiment of an electronic system that includes a semiconductor device including a diode and a conductive strap of the disclosure.

Semiconductor devices like those previously described herein may be used in embodiments of electronic systems of the present invention. For example, FIG. 15 is a block diagram of an illustrative electronic system 300 according to the present invention. The electronic system 300 may include, for example, a computer or computer hardware component, a server or other networking hardware component, a cellular telephone, a digital camera, a personal digital assistant (PDA), portable media (e.g., music) player, etc. The electronic system 300 includes at least one memory device 301. The electronic system 300 may further include at least one electronic signal processor device 302 (often referred to as a "microprocessor"). At least one of the electronic signal processor device 302 and the at least one memory device 301 may include, for example, an embodiment of the semiconductor device 100, 200 described above. In other words, at least one of the electronic signal processor device 302 and the at least one memory device 301 may include an embodiment of a semiconductor device including a diode structure over a conductive material as previously described in relation to the semiconductor devices 100, 200 shown in FIGS. 8 and 14, respectively. The electronic system 300 may further include one or more input devices 304 for inputting information into the electronic system 300 by a user, such as, for example, a mouse or other pointing device, a keyboard, a touchpad, a button, or a control panel. The electronic system 300 may further include one or more output devices 306 for outputting information (e.g., visual or audio output) to a user such as, for example, a monitor, a display, a printer, an audio output jack, a speaker, etc. In some embodiments, the input device 304 and the output device 306 may include a single touchscreen device that can be used both to input information to the electronic system 300 and to output visual information to a user. The one or more input devices 304 and output devices 306 may communicate electrically with at least one of the memory device 301 and the electronic signal processor device 302.

CONCLUSION

In some embodiments, the present invention includes semiconductor devices including diode structures having a conductive strap and methods for forming such devices. Such devices may include a conductive material over an insulator material, at least one diode comprising a single crystalline silicon material over the conductive material, the diode having a first doped region overlying the conductive material and a second doped region overlying the first doped region wherein the conductivity of the first doped region is opposite the conductivity of the second doped region, and a memory cell over the second doped region. The memory cell may include a bottom electrode, a memory medium, and a top electrode. In some embodiments, the top electrode may be a bit line. In other embodiments, a bit line may be electrically coupled to the memory cell.

In additional embodiments, the present invention includes a semiconductor device that includes an insulator material on a first semiconductor substrate, an adhesion material bonded to the insulator material, a conductive material over the adhesion material, wherein the conductive material and the adhesion material are patterned to form at least one conductive strap, at least one diode over the conductive strap, and a memory cell on the at least one diode. The conductive strap may comprise a word line.

In additional embodiments, the present invention includes a semiconductor device including a first semiconductor substrate having an insulator material thereon, an adhesion material bonded to the insulator material, a conductive material over the adhesion material, wherein the conductive material and the adhesion material are patterned to form at least two conductive straps, a plurality of diodes on each of the at least two conductive straps, each diode comprising a single crystalline silicon material, and a plurality of memory cells, one memory cell of the plurality of memory cells being on each of the plurality of diodes.

In yet further embodiments, the present invention includes methods for fabricating a semiconductor device that include forming a base comprising a second semiconductor substrate comprising a single crystalline silicon material having a first doped region and a second doped region, a conductive material, an adhesion material, and an insulator material overlying a first semiconductor substrate, forming a top electrode, a memory medium, and a bottom electrode over the second semiconductor substrate, removing a portion of the top electrode, the memory medium, the bottom electrode, the second semiconductor substrate, the conductive material, and the adhesion material to form at least one conductive strap having a pillar of the top electrode, the memory medium, the bottom electrode and the second semiconductor substrate thereon, and removing another portion of the top electrode, the memory medium, the bottom electrode, and the second semiconductor substrate to form at least one diode over the at least one conductive strap having a memory cell on the at least one diode.

In yet further embodiments, the present invention includes methods of forming a semiconductor device that include forming a base comprising a second semiconductor substrate comprising a single crystalline silicon material having a first doped region and a second doped region, a conductive material, an adhesion material, and an insulator material overlying a first semiconductor substrate, forming a bottom electrode over the second semiconductor substrate, removing a portion of the bottom electrode, the second semiconductor substrate, the conductive material, and the adhesion material to form at least one conductive strap having a pillar of the bottom electrode and the second semiconductor substrate thereon, and removing another portion of the bottom electrode, and the second semiconductor substrate to form at least one diode over the at least one conductive strap having a portion of the bottom electrode on the at least one diode, forming a memory medium over each portion of the bottom electrode, and forming at bit line over the memory medium.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method for fabricating a semiconductor device, comprising:
    providing a first semiconductor substrate;
    forming a first insulator material over the first semiconductor substrate;
    providing a second semiconductor substrate comprising a single crystalline silicon material having a first doped region and a second doped region;
    forming a conductive material over the second semiconductor substrate;
    forming an amorphous adhesion material over and in direct contact with the conductive material, the amorphous adhesion, material comprising one or both of amorphous silicon and amorphous germanium; and
    bonding the first and second substrates, to each other, the bonding comprising positioning the amorphous adhesion material directly against the insulator material over the first semiconductor substrate.

2. The method of claim 1 further comprising forming a top electrode, a memory medium, and a bottom electrode over the second semiconductor substrate.

3. The method of claim 2 further comprising removing a first portion of the top electrode, the memory medium, the bottom electrode, the second semiconductor substrate, the conductive material, and the adhesion material to form at least one conductive strap having a pillar of the top electrode, the memory medium, the bottom electrode and the second semiconductor substrate thereon.

4. The method of claim 3 further comprising removing another portion of the top electrode, the memory medium, the bottom electrode, and the second semiconductor substrate to form at least one diode over the at least one conductive strap having a memory cell on the at least one diode.

5. A method for fabricating a semiconductor device, comprising:
    forming an insulator material on d first semiconductor substrate;
    forming a conductive material and an adhesion material overlying a second semiconductor substrate;
    positioning the insulator material on the first semiconductor substrate in direct contact with the adhesion material and bonding the adhesion material of the second substrate to the insulator material to forma base comprising the first and second semiconductor substrates;
    forming a first doped region and a second doped region within a monocrystalline silicon material of the second semi conductor substrate;
    forming a bottom electrode over the second semiconductor substrate;
    removing a first portion of the bottom electrode, the second semiconductor substrate, the conductive material, and the adhesion material to form at least one conductive strap having a pillar of the bottom electrode and the second semiconductor substrate thereon; and
    removing a second portion of the bottom electrode and the second semiconductor substrate to form at least one diode over the at least one conductive strap wherein a portion of the bottom electrode overlies the at least one diode; and
    forming a memory medium over each portion of the bottom electrode.

6. The method of claim 5, further comprising
    doping the precursor semiconductor substrate to form the first doped region proximate the conductive material and the second doped region adjacent the first doped region;
    implanting ions into the second doped region of the precursor semiconductor substrate to form an implanted zone therein; and
    removing a portion of the precursor semiconductor substrate proximate the implanted zone of the precursor semiconductor substrate.

7. The method of claim 5, further comprising forming a bit line in electrical communication with the memory cell on the at least one diode.

8. The method of claim 5, further comprising forming a logic device on the first semiconductor substrate.

9. The method of claim 5, wherein removing the first portion of the top electrode, the memory medium, the bottom electrode, the second semiconductor substrate, the conductive material, and the adhesion material to form at least one conductive strap having a pillar of the top electrode, the memory medium, the bottom electrode and the semiconductor substrate thereon comprises forming a plurality of trenches extending in a direction parallel to the pillar.

10. The method of claim 5, wherein removing the second portion of the top electrode, the memory medium, the bottom electrode, and the second semiconductor substrate to form at least one diode over the at least one conductive strap having a memory cell on the at least one diode comprises removing another portion of the top electrode, the memory medium, the bottom electrode, and the second semiconductor substrate in a second direction substantially perpendicular to the pillar.

11. The method of claim 5 wherein the adhesion material is amorphous and comprises at least one of amorphous silicon and amorphous germanium.

12. A method of forming a semiconductor device, comprising:
    providing a first substrate comprising an insulator material;
    providing a second substrate comprising a conductive material;
    forming an amorphous adhesion material over the conductive material;
    forming a bonded structure by inverting the second substrate over the first substrate such that the amorphous adhesion material directly contacts the insulator material;
    forming trenches through the second substrate;
    forming at least one diode over the conductive material in the bonded structure.

13. The method of claim 12 wherein the at least one diode comprises a first doped region overlying the conductive region and a second doped region overlying the first doped region, the conductivity of the first doped region being opposite the conductivity of the second doped region.

14. The method of claim 13 further comprising, forming a memory cell over the second doped region.

15. The method of claim 12 wherein the amorphous adhesion material comprises one or both of amorphous silicon and amorphous germanium.

16. The method of claim 12 wherein the at least one diode comprises a single crystalline silicon material over the conductive material in the bonded structure.

17. The method of claim 12 wherein the at least one diode has a width of less than about 20 nm.

* * * * *

UNITED STATES PATENT AND TRADEMARK OFFICE
CERTIFICATE OF CORRECTION

PATENT NO. : 10,157,769 B2
APPLICATION NO. : 15/481301
DATED : December 18, 2018
INVENTOR(S) : Sanh D. Tang and Ming Zhang Page 1 of 1

It is certified that error appears in the above-identified patent and that said Letters Patent is hereby corrected as shown below:

In the Claims

Column 17, Line 47 Claim 5 – Replace "on d first" with --on a first--

Signed and Sealed this
Nineteenth Day of March, 2019

Andrei Iancu
*Director of the United States Patent and Trademark Office*